United States Patent
Kobata et al.

(10) Patent No.: US 10,343,255 B2
(45) Date of Patent: Jul. 9, 2019

(54) POLISHING APPARATUS

(71) Applicant: EBARA CORPORATION

(72) Inventors: Itsuki Kobata, Tokyo (JP); Yoichi Kobayashi, Tokyo (JP); Katsutoshi Ono, Tokyo (JP); Masaki Kinoshita, Tokyo (JP); Toshifumi Kimba, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 15/949,960

(22) Filed: Apr. 10, 2018

(65) Prior Publication Data
US 2018/0229346 A1 Aug. 16, 2018

Related U.S. Application Data

(60) Continuation of application No. 14/808,252, filed on Jul. 24, 2015, now Pat. No. 9,969,048, which is a
(Continued)

(30) Foreign Application Priority Data

Dec. 27, 2010 (JP) .................................. 2010-289209

(51) Int. Cl.
*B24B 49/12* (2006.01)
*B24B 37/013* (2012.01)
(Continued)

(52) U.S. Cl.
CPC ............ *B24B 37/26* (2013.01); *B24B 37/005* (2013.01); *B24B 37/013* (2013.01); *B24B 37/04* (2013.01);
(Continued)

(58) Field of Classification Search
CPC ..... B24B 37/013; B24B 37/04; B24B 37/042; B24B 37/10; B24B 37/205; B24B 37/30; B24B 49/12
(Continued)

(56) References Cited

U.S. PATENT DOCUMENTS 5,609,511 A * 3/1997 Moriyama ............ B24B 37/013
451/5
5,672,091 A * 9/1997 Takahashi ............. B24B 37/013
451/287
(Continued)

FOREIGN PATENT DOCUMENTS

JP 09-85611 A 3/1997
JP 2001-105308 A 4/2001
(Continued)

*Primary Examiner* — Eileen P Morgan
(74) *Attorney, Agent, or Firm* — Baker & Hostetler LLP

(57) ABSTRACT

A polishing apparatus for polishing a substrate is provided. The polishing apparatus includes: a polishing table holding a polishing pad; a top ring configured to press the substrate against the polishing pad; first and second optical heads each configured to apply the light to the substrate and to receive reflected light from the substrate; spectroscopes each configured to measure at each wavelength an intensity of the reflected light received; and a processor configured to produce a spectrum indicating a relationship between intensity and wavelength of the reflected light. The first optical head is arranged so as to face a center of the substrate, and the second optical head is arranged so as to face a peripheral portion of the substrate.

11 Claims, 25 Drawing Sheets

Related U.S. Application Data division of application No. 13/330,881, filed on Dec. 20, 2011, now Pat. No. 9,401,293.

(51) Int. Cl.
| | |
|---|---|
| *B24B 37/10* | (2012.01) |
| *B24B 37/26* | (2012.01) |
| *H01L 21/67* | (2006.01) |
| *H01L 21/687* | (2006.01) |
| *B24B 37/04* | (2012.01) |
| *B24B 37/20* | (2012.01) |
| *B24B 37/005* | (2012.01) |
| *H01L 21/3105* | (2006.01) |
| *H01L 21/66* | (2006.01) |

(52) U.S. Cl.
CPC ............ *B24B 37/042* (2013.01); *B24B 37/10* (2013.01); *B24B 37/205* (2013.01); *B24B 49/12* (2013.01); *H01L 21/31053* (2013.01); *H01L 21/67075* (2013.01); *H01L 21/67092* (2013.01); *H01L 21/67253* (2013.01); *H01L 21/68721* (2013.01); *H01L 22/26* (2013.01)

(58) Field of Classification Search
USPC ......... 451/6, 10, 11, 4, 54, 59, 63, 285, 287, 451/288
See application file for complete search history.

(56) References Cited

U.S. PATENT DOCUMENTS

| | | | | |
|---|---|---|---|---|
| 5,700,180 A * | 12/1997 | Sandhu | ................ | B23Q 15/013 451/21 |
| 5,838,447 A * | 11/1998 | Hiyama | ................ | B24B 37/205 356/600 |
| 6,106,662 A * | 8/2000 | Bibby, Jr. | ............. | B24B 37/013 156/345.13 |
| 6,190,234 B1 | 2/2001 | Swedek et al. | | |
| 6,384,915 B1 * | 5/2002 | Everett | ................ | A61B 5/0066 356/336 |
| 6,785,010 B2 * | 8/2004 | Kimba | ...................... | B08B 1/04 356/630 |
| 6,960,115 B2 * | 11/2005 | Weldon | ................. | B24B 37/013 451/41 |
| 7,018,271 B2 | 3/2006 | Wiswesser et al. | | |
| 7,115,017 B1 * | 10/2006 | Laursen | ................. | B24B 37/30 451/5 |
| 7,247,080 B1 * | 7/2007 | Bennett | ............ | G05B 19/41875 451/41 |
| 7,252,575 B2 * | 8/2007 | Kobayashi | .............. | B24B 49/12 451/41 |
| 7,264,537 B1 * | 9/2007 | Laursen | ................. | B24B 37/013 451/41 |
| 2003/0098704 A1 * | 5/2003 | Du-Nour | ................ | G01B 11/16 324/754.23 |
| 2004/0058621 A1 | 3/2004 | Wiswesser et al. | | |
| 2010/0015889 A1 * | 1/2010 | Shimizu | ................ | B24B 37/013 451/5 |
| 2010/0029177 A1 | 2/2010 | Kobayashi et al. | | |
| 2011/0210691 A1 * | 9/2011 | Ziprani | .................. | G01B 11/06 318/640 |
| 2012/0196511 A1 | 8/2012 | David et al. | | |

FOREIGN PATENT DOCUMENTS

| | | |
|---|---|---|
| JP | 2001-235311 A | 8/2001 |
| JP | 2001-284298 A | 10/2001 |
| JP | 2002-359217 A | 12/2002 |
| JP | 2004-001227 A | 1/2004 |
| JP | 2004-154928 A | 6/2004 |
| JP | 2005-268424 A | 9/2005 |
| JP | 2005-340679 A | 12/2005 |
| JP | 2009-505847 A | 2/2009 |
| JP | 2010-023210 A | 2/2010 |
| WO | WO 2004/035265 A1 | 4/2004 |
| WO | WO 2007/024807 A2 | 3/2007 |

\* cited by examiner

PATH OF FILM-THICKNESS MEASURING DEVICE

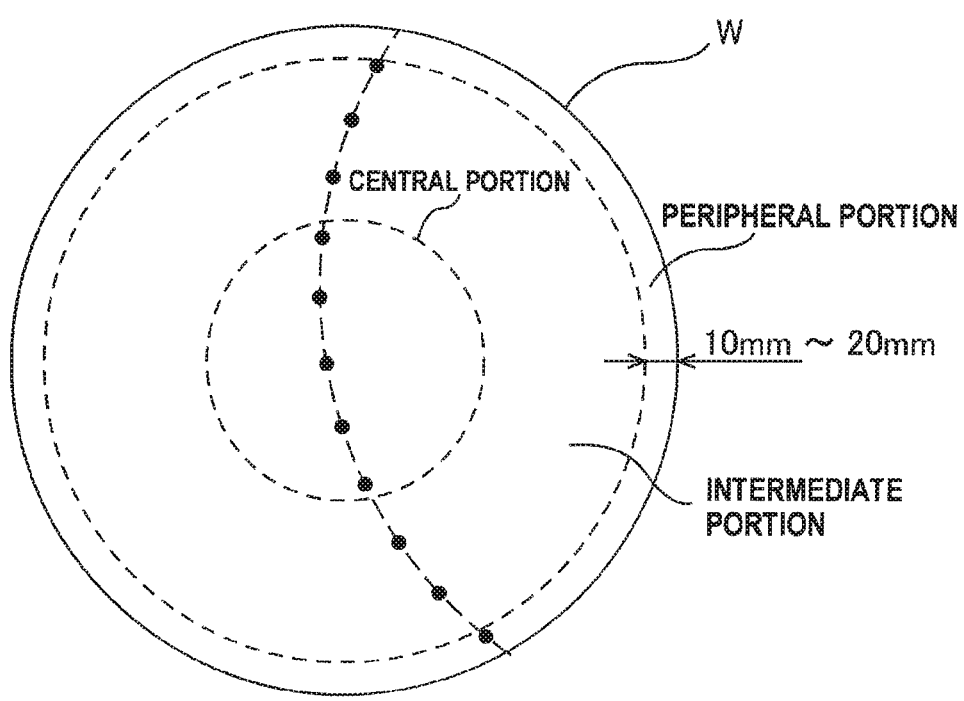

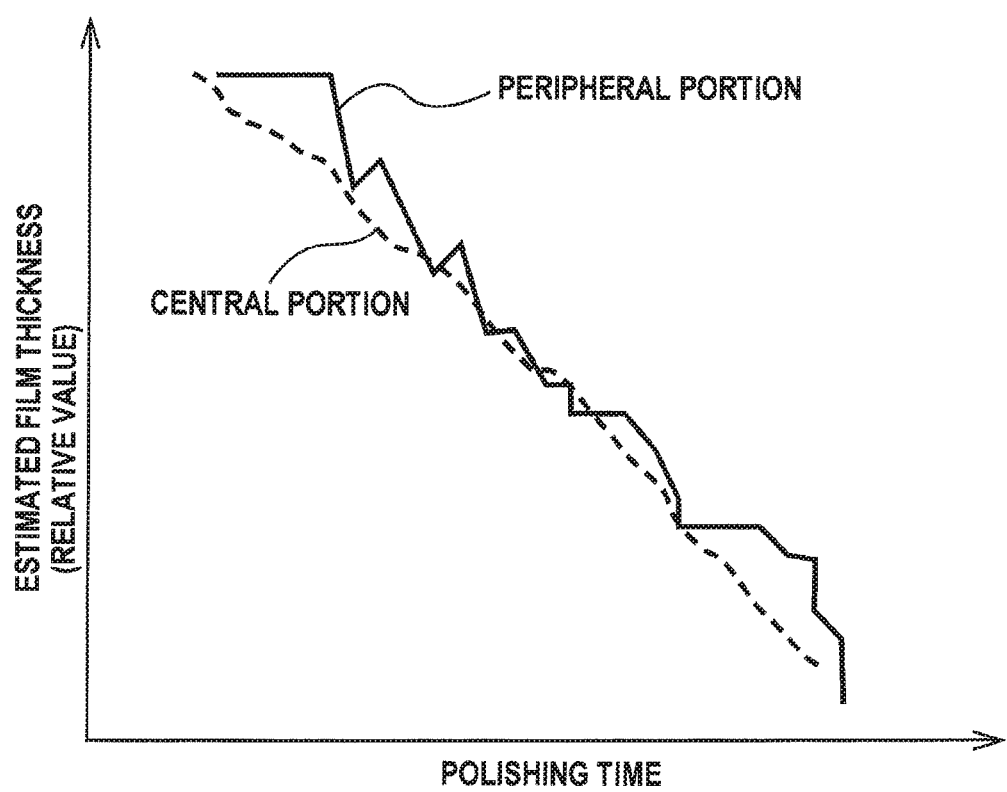

PATH OF FIRST OPTICAL HEAD

POLISHING APPARATUS

CROSS REFERENCE TO RELATED APPLICATIONS

This application is a continuation of U.S. patent application Ser. No. 14/808,252 filed Jul. 24, 2015, which is a divisional of U.S. patent application Ser. No. 13/330,881, filed Dec. 20, 2011, which claims the benefit of Japanese Patent Application No. 2010-289209, filed Dec. 27, 2010, the entire contents of which are incorporated herein by reference.

BACKGROUND OF THE INVENTION

Field of the Invention

The present invention relates to a polishing apparatus for polishing a surface of a substrate, such as a semiconductor wafer, and more specifically to a polishing apparatus and a polishing method which obtain a film-thickness distribution over the entire substrate surface including a central portion and a peripheral portion thereof during polishing of the substrate and control a load on the substrate based on the film-thickness distribution.

Description of the Related Art

A CMP (chemical mechanical polishing) apparatus is widely known as equipment for polishing a surface of a substrate, such as a semiconductor wafer. This CMP apparatus polishes the surface of the substrate by pressing the substrate against a polishing pad on a rotating polishing table while supplying a polishing liquid onto the polishing pad. The CMP apparatus typically has a film-thickness measuring device for measuring a film thickness or a signal equivalent to the film thickness. The CMP apparatus having such a film-thickness measuring device controls a polishing load on the substrate based on a measured value of the film thickness obtained from the film-thickness measuring device and to determine a polishing end point. An eddy current sensor or an optical sensor is generally used as the film-thickness measuring device.

FIG. 1 is a plan view showing a positional relationship between film-thickness measuring device of a conventional CMP apparatus and substrate. A film-thickness measuring device 100 is provided in a polishing table 102 so as to face a substrate W on a polishing pad 105. The film-thickness measuring device 100 measures the film thickness at multiple measuring points on the substrate W while moving across the substrate W each time the polishing table 102 rotates. In the conventional CMP apparatus, the film-thickness measuring device 100 is arranged so as to pass through the center of the substrate W, as shown in FIG. 1. This is for the purpose of measuring the film thickness at multiple measuring points distributed in a radial direction of the substrate W, as shown in FIG. 2.

There exist microcircuit patterns on the surface of the substrate to be polished. In some regions on the substrate, the existence of such circuit patterns could cause a difference in obtained data indicating the film thickness (e.g., voltage value or current value in the case of using the eddy current sensor, relative reflectance in the case of using the optical sensor) even when the film thickness is the same. Thus, in order to avoid such an influence of the circuit patterns, smoothing is performed on the data.

The CMP apparatus determines the polishing loads on multiple regions (e.g., a central portion, an intermediate portion, a peripheral portion) of the substrate based on a film-thickness profile obtained during polishing and polishes the substrate so as to make the film thickness uniform. However, in the conventional CMP apparatus, an accurate film thickness cannot be obtained in the peripheral portion of the substrate because of the smaller number of measuring points on this portion. This problem will be explained with reference to FIG. 2. FIG. 2 is a view showing measuring points on the substrate at which film-thickness measurement is performed while the polishing table makes one revolution. The peripheral portion of the substrate is an outermost annular portion having a width ranging from 10 mm to 20 mm. Because of its narrow width, the number of measuring points on the peripheral portion is small, as can be seen from FIG. 2.

The peripheral portion of the substrate is most likely to be affected by the polishing load and the polishing liquid, and therefore the film thickness is likely to vary greatly during polishing as compared with other regions. Moreover, an initial film thickness in the peripheral portion of the substrate is, in many cases, larger than that in other regions. Thus, it is necessary to accurately measure and monitor the film thickness in the peripheral portion during polishing of the substrate. However, as described above, it is difficult to obtain an accurate film thickness in the peripheral portion because of the smaller number of measuring points on this portion.

FIG. 3 is a graph showing a change in the measured value of the film thickness in the central portion of the substrate and a change in the measured value of the film thickness in the peripheral portion of the substrate. In FIG. 3, a vertical axis represents measured value (estimated value) of the film thickness obtained by the optical sensor, and a horizontal axis represents polishing time. As can be seen from FIG. 3, the film thickness in the central portion (see FIG. 2) of the substrate decreases gradually with the polishing time, while the film thickness in the peripheral portion (see FIG. 2) varies irregularly. This is because the small number of measuring points in the peripheral portion cannot provide sufficient data for the smoothing. In particular, when the polishing table rotates at a high speed, the number of measuring points in the peripheral portion becomes even smaller.

As described above, it is difficult to obtain highly-accurate film-thickness data in the peripheral portion of the substrate, and consequently a highly-accurate film-thickness profile of the substrate cannot be obtained during polishing. As a result, it has been difficult to obtain a desired film-thickness profile through feedback of the film-thickness profile to the polishing load.

SUMMARY OF THE INVENTION

The present invention has been made in view of the above drawback. It is therefore an object of the present invention to provide a polishing apparatus and a polishing method capable of obtaining highly-accurate film-thickness data over a substrate surface in its entirety including a central portion and a peripheral portion.

One aspect of the present invention for achieving the above object is to provide an apparatus for polishing a substrate having a film thereon by bringing the substrate into sliding contact with a polishing pad. The apparatus includes: a rotatable polishing table for holding the polishing pad; a top ring configured to hold the substrate and to press a surface of the substrate against the polishing pad; at least one light source configured to emit light; a first optical head configured to apply the light to the surface of the substrate and to receive reflected light from the substrate; a second optical head configured to apply the light to the surface of the substrate and to receive reflected light from the substrate; at least one spectroscope configured to measure at each wavelength an intensity of the reflected light received by the first optical head and the second optical head; and a processor configured to produce a spectrum from the intensity of the reflected light at each wavelength measured by the spectroscope and to determine a thickness of the film of the substrate from the spectrum produced. The spectrum indicates a relationship between intensity and wavelength of the reflected light. The first optical head is arranged so as to face a center of the substrate held by the top ring, and the second optical head is arranged so as to face a peripheral portion of the substrate held by the top ring.

In a preferred aspect of the present invention, the second optical head is located outwardly of the first optical head with respect to a radial direction of the polishing table.

In a preferred aspect of the present invention, the second optical head is located inwardly of the first optical head with respect to a radial direction of the polishing table.

In a preferred aspect of the present invention, the first optical head and the second optical head are located at different positions with respect to a circumferential direction of the polishing table.

In a preferred aspect of the present invention, a line connecting the first optical head to the center of the polishing table and a line connecting the second optical head to the center of the polishing table meet at an angle of substantially 180 degrees.

In a preferred aspect of the present invention, the second optical head is located outwardly of the polishing table.

In a preferred aspect of the present invention, the apparatus further includes a controller for determining load on the substrate. The top ring has a mechanism configured to press a central portion and the peripheral portion of the substrate independently against the polishing pad, and the controller is configured to determine loads of the top ring on the central portion and the peripheral portion based on a film thickness at the central portion and a film thickness at the peripheral portion.

Another aspect of the present invention is to provide an apparatus for polishing a substrate having a film thereon by bringing the substrate into sliding contact with a polishing pad. The apparatus include: a rotatable polishing table for holding the polishing pad; a top ring configured to hold the substrate and to press a surface of the substrate against the polishing pad; and a first film-thickness sensor and a second film-thickness sensor each configured to measure a thickness of the film of the substrate. The first film-thickness sensor is arranged so as to face a center of the substrate held by the top ring, and the second film-thickness sensor is arranged so as to face a peripheral portion of the substrate held by the top ring.

Still another aspect of the present invention is to provide a method of polishing a substrate having a film thereon by bringing the substrate into sliding contact with a polishing pad. The method includes: rotating a polishing table holding the polishing pad; pressing a surface of the substrate against the rotating polishing pad; applying light to the surface of the substrate from a first optical head arranged so as to face a center of the substrate and receiving reflected light from the substrate by the first optical head; applying light to the surface of the substrate from a second optical head arranged so as to face a peripheral portion of the substrate and receiving reflected light from the substrate by the second optical head; measuring at each wavelength an intensity of the reflected light received by the first optical head and the second optical head; producing a spectrum from the measured intensity, the spectrum indicating a relationship between intensity and wavelength of the reflected light; and determining a thickness of the film of the substrate from the spectrum.

In a preferred aspect of the present invention, the first optical head and the second optical head apply the light to the surface of the substrate and receive the reflected light from the substrate at different times.

In a preferred aspect of the present invention, the first optical head and the second optical head apply the light to the surface of the substrate and receive the reflected light from the substrate alternately at substantially constant time intervals.

In a preferred aspect of the present invention, the peripheral portion of the substrate is an outermost annular portion of the substrate, and a width of the peripheral portion is in a range of 10 mm to 20 mm.

According to the present invention, the tip of the second optical head moves along the peripheral portion of the substrate with the rotation of the polishing table. Therefore, the number of measuring points on the peripheral portion is increased, so that more highly accurate film thickness can be obtained. As a result, a highly-accurate film-thickness profile (i.e., a film-thickness distribution along the radial direction of the substrate) can be created during polishing, and a desired film-thickness profile can be obtained based on the created film-thickness profile.

BRIEF DESCRIPTION OF THE DRAWINGS

FIG. 2 is a view showing measuring points on the substrate at which film-thickness measurement is performed while a polishing table makes one revolution;

FIG. 3 is a graph showing a change in measured value of the film thickness in a central portion of the substrate and a change in measured value of the film thickness in a peripheral portion of the substrate;

DETAILED DESCRIPTION OF PREFERRED EMBODIMENTS

Figure 1:
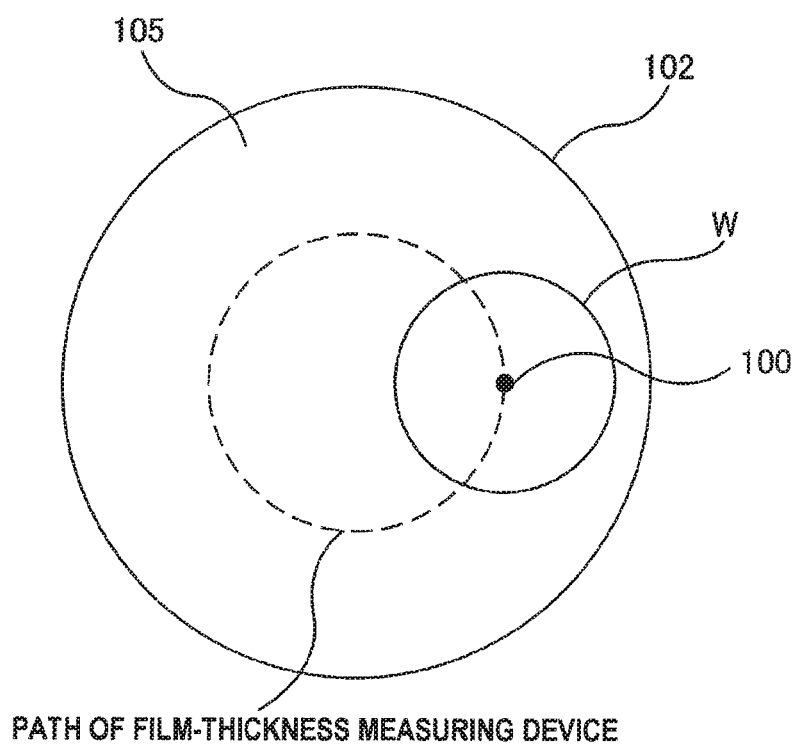
FIG. 1 is a plan view showing a positional relationship between film-thickness measuring device of a conventional CMP apparatus and substrate.
Figure 4A:
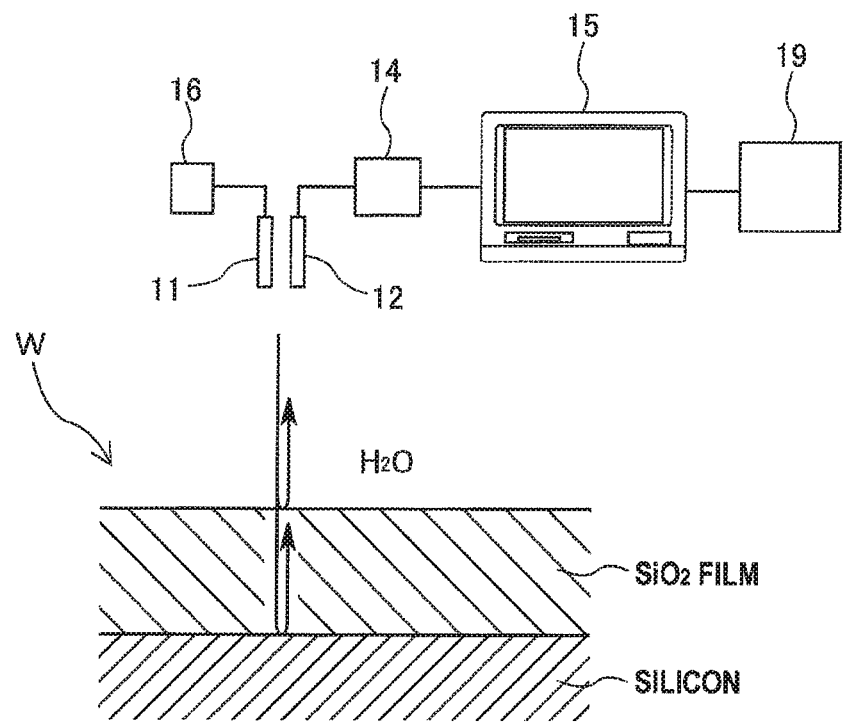
FIG. 4A is a schematic view showing the principle of determining a film thickness based on a spectrum of a reflected light from a substrate.
Figure 4B:
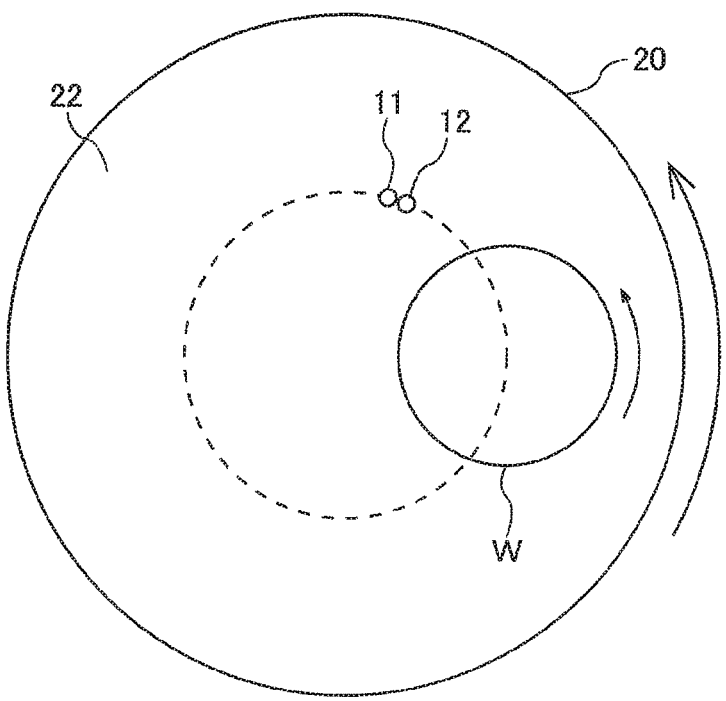
FIG. 4B is a plan view showing a positional relationship between the substrate and a polishing table.

Embodiments of the present invention will be described below with reference to the drawings. FIG. 4A is a schematic view showing the principle of determining a film thickness based on a spectrum of a reflected light from a substrate, and FIG. 4B is a plan view showing a positional relationship between the substrate and a polishing table. As shown in FIG. 4A, a substrate W, to be polished, has an underlying layer (e.g., a silicon layer) and a film (e.g., a dielectric film, such as $SiO_2$, having a property of light permeability) formed on the underlying layer. A surface of the substrate W is pressed against a polishing pad 22 on a rotating polishing table 20, so that the film of the substrate W is polished by sliding contact with the polishing pad 22.

A light-applying unit 11 and a light-receiving unit 12 are arranged so as to face the surface of the substrate W. The light-applying unit 11 is coupled to a light source 16, and light emitted by the light source 16 is directed to the surface of the substrate W by the light-applying unit 11. The light-applying unit 11 applies the light in a direction substantially perpendicular to the surface of the substrate W, and the light-receiving unit 12 receives the reflected light from the substrate W. The light emitted by the light source 16 is multi-wavelength light. As shown in FIG. 4B, the light is applied to the surface of the substrate W each time the polishing table 20 makes one revolution. A spectroscope 14 is coupled to the light-receiving unit 12. This spectroscope 14 is configured to disperse the reflected light according to wavelength and to measure the intensity of the reflected light at each wavelength.

A processor 15 is coupled to the spectroscope 14. This processor 15 is configured to read measurement data obtained by the spectroscope 14 and to produce intensity distribution of the reflected light from the measured values of the light intensity. More specifically, the processor 15 produces a spectrum (spectral profile) which indicates the light intensity at each of the wavelengths. This spectrum is expressed as a line graph indicating a relationship between wavelength and intensity of the reflected light. The processor 15 is further configured to determine the film thickness of the substrate W from the spectrum and to determine a polishing end point. A general-purpose computer or a dedicated computer can be used as the processor 15. The processor 15 performs predetermined processing steps according to a program (or computer software).

Figure 5:
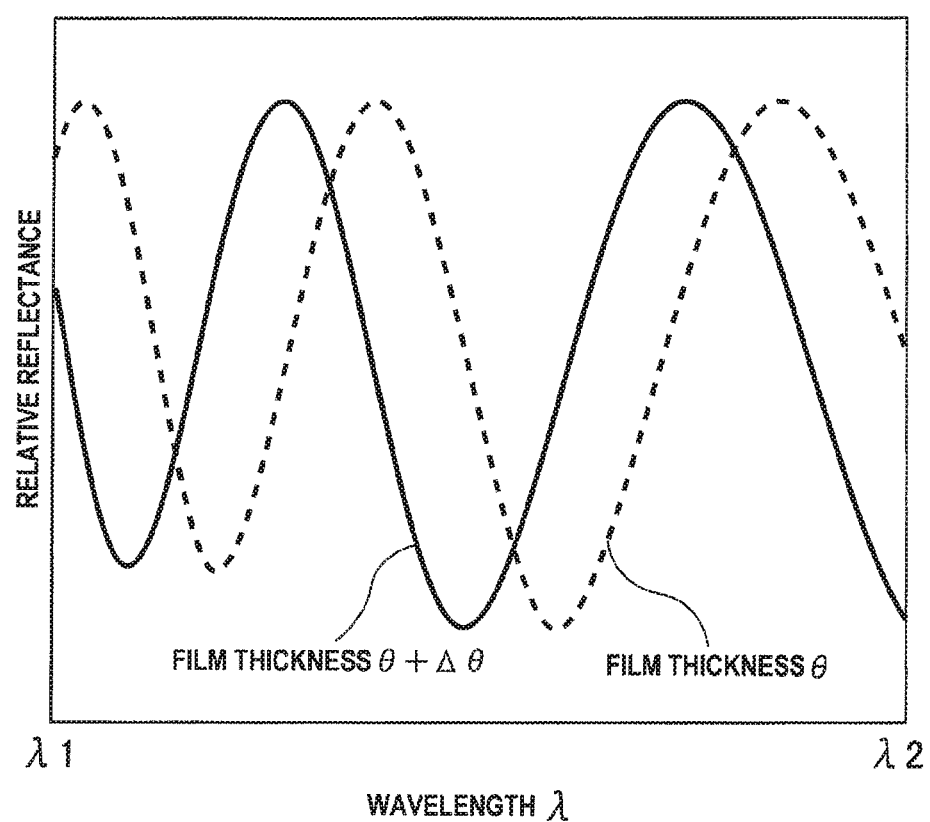
FIG. 5 is a graph showing spectra of the reflected light obtained by performing a polishing simulation on the substrate shown in FIG. 4A based on the theory of interference of light.

FIG. 5 is a graph showing spectra of the reflected light obtained by performing a polishing simulation on the substrate shown in FIG. 4A based on the theory of interference of light. In FIG. 5, a horizontal axis represents wavelength of light, and a vertical axis represents relative reflectance derived from the intensity of the light. The relative reflectance is an index that indicates the intensity of light. More specifically, the relative reflectance is a ratio of the intensity of the reflected light to a predetermined reference intensity. By dividing the intensity of the reflected light (i.e., the actually measured intensity) by the predetermined reference intensity, noise components are removed and therefore intensity of the light with no noise can be obtained. The predetermined reference intensity may be an intensity of the reflected light obtained when polishing a silicon wafer with no film thereon in the presence of water. Instead of the relative reflectance, the intensity of the light may be used as it is.

The spectrum is an arrangement of the light intensity in the order of wavelength and indicates the light intensity at each wavelength. The spectrum varies depending on the film thickness. This phenomenon is due to interference between light waves. Specifically, the light, applied to the substrate, is reflected off an interface between a medium (e.g., water) and the film and an interface between the film and the underlying layer beneath the film. The light waves from these interfaces interfere with each other. The manner of interference between the light waves varies according to the thickness of the film (i.e., a length of an optical path). As a result, the spectrum of the reflected light from the substrate varies depending on the thickness of the film, as shown in FIG. 5.

The processor 15 determines the film thickness from the spectrum obtained. A known technique can be used for determining the film thickness from the spectrum. For example, there is a method of estimating a film thickness by comparing a spectrum obtained during polishing (i.e., an actually measured spectrum) with prepared reference spectra, as disclosed in Japanese laid-open patent publication No. 2009-505847. This method includes the steps of comparing the spectrum at each point of time during polishing with the plural reference spectra and determining a film thickness from a reference spectrum whose shape is most similar to the shape of the measured spectrum. The plural reference spectra are prepared in advance by polishing a substrate that is identical or similar to the substrate to be polished. Each reference spectrum is associated with a film thickness at a point of time when that reference spectrum is obtained. Therefore, the current film thickness can be estimated from the reference spectrum having a shape that is most similar to that of the spectrum obtained during polishing.

The processor 15 is coupled to a controller 19 for determining polishing conditions, such as a polishing load on the substrate. The spectrum created by the processor 15 is sent to the controller 19, which then determines an optimum polishing load for achieving a target film-thickness profile based on the spectrum obtained during polishing and controls the polishing load on the substrate, as will be described later.

Figure 6:
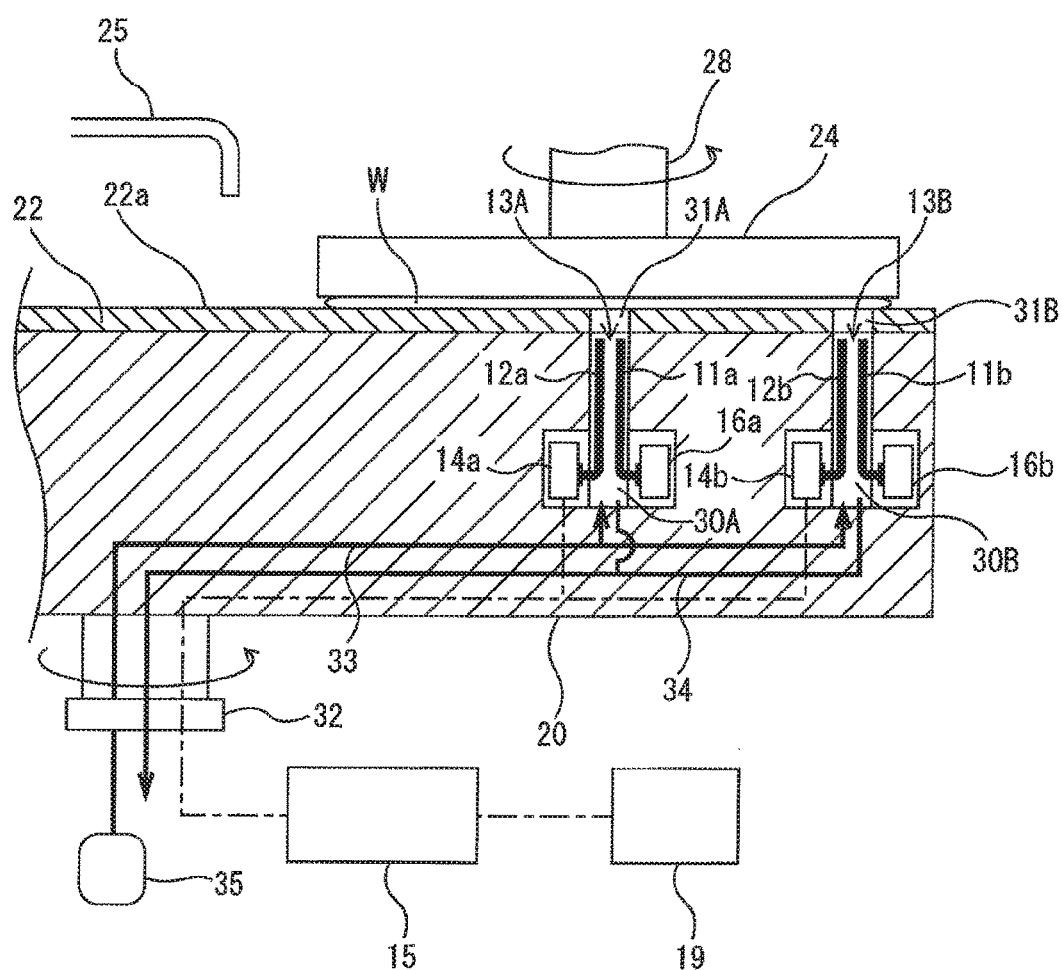
FIG. 6 is a cross-sectional view schematically showing a polishing apparatus according to an embodiment of the present invention.

FIG. 6 is a cross-sectional view schematically showing a polishing apparatus according to an embodiment of the present invention. The polishing apparatus includes the polishing table 20 for supporting the polishing pad 22 thereon, a top ring 24 configured to hold the substrate W and to press the substrate W against the polishing pad 22, and a polishing liquid supply mechanism 25 configured to supply a polishing liquid (slurry) onto the polishing pad 22. The polishing table 20 is coupled to a motor (not shown in the drawing) provided below the polishing table 20, so that the polishing table 20 can rotate about its own axis. The polishing pad 22 is secured to an upper surface of the polishing table 20.

The polishing pad 22 has an upper surface 22a, which provides a polishing surface for polishing the substrate W. The top ring 24 is coupled to a motor and an elevating cylinder (not shown in the drawing) via a top ring shaft 28. With these configurations, the top ring 24 can move in the vertical direction and can rotate about the top ring shaft 28. The top ring 24 has a lower surface which is configured to hold the substrate W by a vacuum suction or the like.

The substrate W, held on the lower surface of the top ring 24, is rotated by the top ring 24, and is pressed by the top ring 24 against the polishing pad 22 on the rotating polishing table 20. Simultaneously, the polishing liquid is supplied onto the polishing surface 22a of the polishing pad 22 from the polishing liquid supply mechanism 25. The surface of the substrate W is polished in the presence of the polishing liquid between the surface of the substrate W and the polishing pad 22. A relative movement mechanism for providing sliding contact between the substrate W and the polishing pad 22 is constructed by the polishing table 20 and the top ring 24.

The polishing table 20 has holes 30A and 30B whose upper ends lying in the upper surface of the polishing table 20. The polishing pad 22 has through-holes 31A and 31B at positions corresponding to the holes 30A and 30B, respectively. The hole 30A and the through-hole 31A are in fluid communication with each other, and the hole 30B and the through-hole 31B are in fluid communication with each other. Upper ends of the through-holes 31A and 31B lie in the polishing surface 22a. The holes 30A and 30B are coupled to a liquid supply source 35 via a liquid supply passage 33 and a rotary joint 32. During polishing, the liquid supply source 35 supplies water (preferably pure water) as a transparent liquid into the holes 30A and 30B. The water fills spaces formed by the lower surface of the substrate W and the through-holes 31A and 31B, and is expelled therefrom through a liquid discharge passage 34. The polishing liquid in the through-holes 31A and 31B is discharged together with the water and thus a path of the light is secured. The liquid supply passage 33 is provided with a valve (not shown in the drawing) configured to operate in conjunction with the rotation of the polishing table 20. The valve operates so as to stop the flow of the water or reduce the flow of the water when the substrate W is not located over the through-holes 31A and 31B.

The polishing apparatus has an optical film-thickness measuring device for measuring the film thickness according to the above-described method. This optical film-thickness measuring device includes light sources 16a and 16b for emitting light, a first light-applying unit 11a configured to direct the light, emitted by the light source 16a, to the surface of the substrate W, a first light-receiving unit 12a configured to receive the reflected light from the substrate W, a second light-applying unit 11b configured to direct the light, emitted by the light source 16b, to the surface of the substrate W, a second light-receiving unit 12b configured to receive the reflected light from the substrate W, spectroscopes 14a and 14b configured to disperse (or break) the reflected light according to the wavelength and to measure the intensity of the reflected light over a predetermined wavelength range, and the processor 15 configured to produce the spectrum from the measurement data obtained by the spectroscopes 14a and 14b and to determine the film thickness of the substrate W based on the spectrum. The spectrum indicates light intensities distributed over the predetermined wavelength range and indicates a relationship between intensity and wavelength of the light.

The first light-applying unit 11a, the first light-receiving unit 12a, the second light-applying unit 11b, and the second light-receiving unit 12b are each constructed by optical fiber. The first light-applying unit 11a and the first light-receiving unit 12a constitute a first optical head (i.e., an optical film-thickness measuring head) 13A, and the second light-applying unit 11b and the second light-receiving unit 12b constitute a second optical head (i.e., an optical film-thickness measuring head) 13B. The first light-applying unit 11a is coupled to the light source 16a, and the second light-applying unit 11b is coupled to the light source 16b. The first light-receiving unit 12a is coupled to the spectroscope 14a, and the second light-receiving unit 12b is coupled to the spectroscope 14b.

A light emitting diode (LED), a halogen lamp, a xenon flash lamp, or the like, which emits multi-wavelength light, can be used for the light sources 16a and 16b. The first light-applying unit 11a, the first light-receiving unit 12a, the second light-applying unit 11b, the second light-receiving unit 12b, the light sources 16a and 16b, and the spectroscopes 14a and 14b are provided in the polishing table 20 and are rotated together with the polishing table 20. The first light-applying unit 11a and the first light-receiving unit 12a are located in the hole 30A formed in the polishing table 20, and tips of the first light-applying unit 11a and the first light-receiving unit 12a are adjacent to the surface, to be polished, of the substrate W. Similarly, the second light-applying unit 11b and the second light-receiving unit 12b are located in the hole 30B formed in the polishing table 20, and tips of the second light-applying unit 11b and the second light-receiving unit 12b are adjacent to the surface, to be polished, of the substrate W.

The first light-applying unit 11a and the first light-receiving unit 11a are arranged perpendicularly to the surface of the substrate W, so that the first light-applying unit 11a applies the light to the surface of the substrate W perpendicularly. Similarly, the second light-applying unit 11b and the second light-receiving unit 12b are arranged perpendicularly to the surface of the substrate W, so that the second light-applying unit 11b applies the light to the surface of the substrate W perpendicularly.

The first light-applying unit 11a and the first light-receiving unit 12a are arranged so as to face the center of the substrate W held by the top ring 24. Therefore, as shown in FIG. 4B, each time the polishing table 20 rotates, the tips of the first light-applying unit 11a and the first light-receiving unit 12a move across the substrate W and the light is applied to regions including the center of the substrate W. This is for the purpose of measuring the film thickness over the entire surface of the substrate W, including a central portion of the substrate W, through the first light-applying unit 11a and the first light-receiving unit 12a passing through the center of the substrate W. The processor 15 can therefore produce a film-thickness profile (i.e., a film-thickness distribution) based on the film thickness data measured.

The second light-applying unit 11b and the second light-receiving unit 12b are arranged so as to face a peripheral portion of the substrate W held by the top ring 24. The tips of the second light-applying unit 11b and the second light-receiving unit 12b move along the peripheral portion of the substrate W each time the polishing table 20 rotates. Therefore, the light is applied to the peripheral portion of the substrate W each time the polishing table 20 rotates.

During polishing, the substrate W is irradiated with the light from the first light-applying unit 11a and the second light-applying unit 11b. The light from the first light-applying unit 11a is reflected off the surface of the substrate W, and the reflected light is received by the first light-receiving unit 12a. The light from the second light-applying unit 11b is reflected off the surface of the substrate W, and the reflected light is received by the second light-receiving unit 12b. While the substrate W is irradiated with the light, the water is supplied into the hole 30A and the through-hole 31A, so that the space formed between the surface of the substrate W and the respective tips of the first light-applying unit 11a and first light-receiving unit 12a is filled with the water. Similarly, while the substrate W is irradiated with the light, the water is supplied into the hole 30B and the through-hole 31B, so that the space formed between the surface of the substrate W and the respective tips of the second light-applying unit 11b and second light-receiving unit 12b is filled with the water.

The spectroscope 14a is configured to disperse the reflected light sent from the first light-receiving unit 12a according to wavelength and to measure the intensity of the reflected light at each wavelength. Similarly, the spectroscope 14b is configured to disperse the reflected light sent from the second light-receiving unit 12b according to wavelength and to measure the intensity of the reflected light at each wavelength. The processor 15 creates the spectrum from the intensity of the reflected light measured by the spectroscope 14a and the spectroscope 14b. The spectrum shows a relationship between the intensity and the wavelength of the reflected light. Further, the processor 15 determines the current film thickness of the substrate W using the previously-described known technique.

Figure 7:
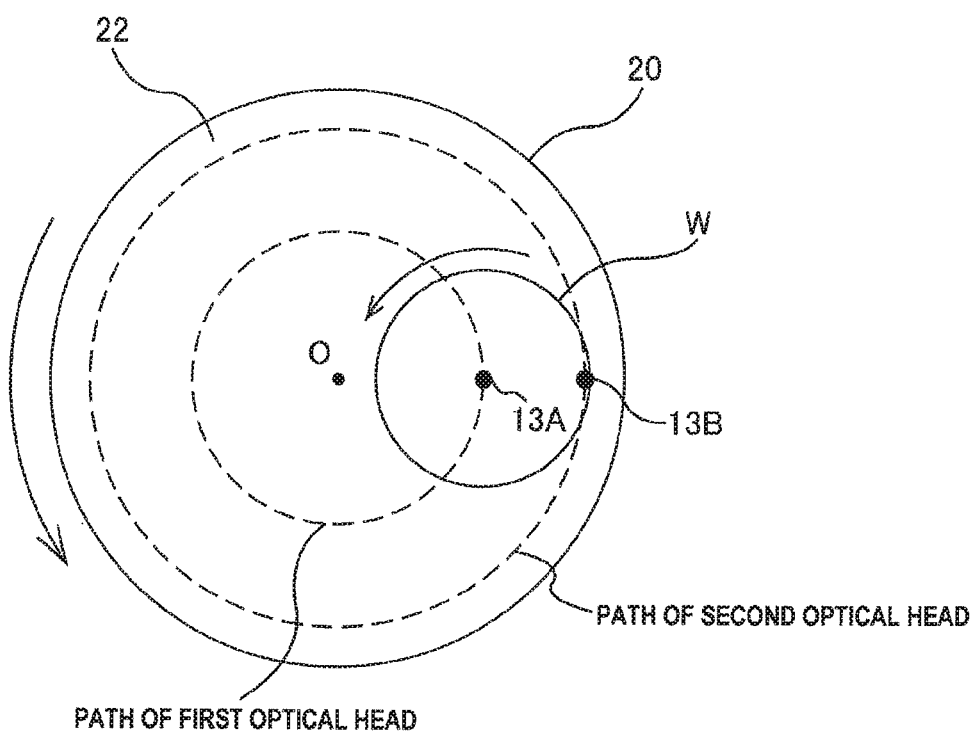
FIG. 7 is a plan view showing arrangement of a first optical head having a first light-applying unit and a first light-receiving unit and a second optical head having a second light-applying unit and a second light-receiving unit.

FIG. 7 is a plan view of arrangement of the first optical head 13A having the first light-applying unit 11a and the first light-receiving unit 12a and the second optical head 13B having the second light-applying unit 11b and the second light-receiving unit 12b. As shown in FIG. 7, the center of the substrate W is located on a path of the first optical head 13A, and the peripheral portion of the substrate W is located on a path of the second optical head 13B. As can be seen from FIG. 7, the second optical head 13B moves across only the peripheral portion of the substrate W and its travelling direction is approximately in the circumferential direction of the substrate W.

The first optical head 13A and the second optical head 13B are arranged along the radial direction of the polishing table 20. Therefore, a line connecting the first optical head 13A to the center O of the polishing table 20 and a line connecting the second optical head 13B to the center O of the polishing table 20 meet at an angle of 0 degree. The second optical head 13B is located outwardly of the first optical head 13A with respect to the radial direction of the polishing table 20. Specifically, a distance between the second optical head 13B and the center O of the polishing table 20 is longer than a distance between the first optical head 13A and the center O of the polishing table 20.

Figure 8:
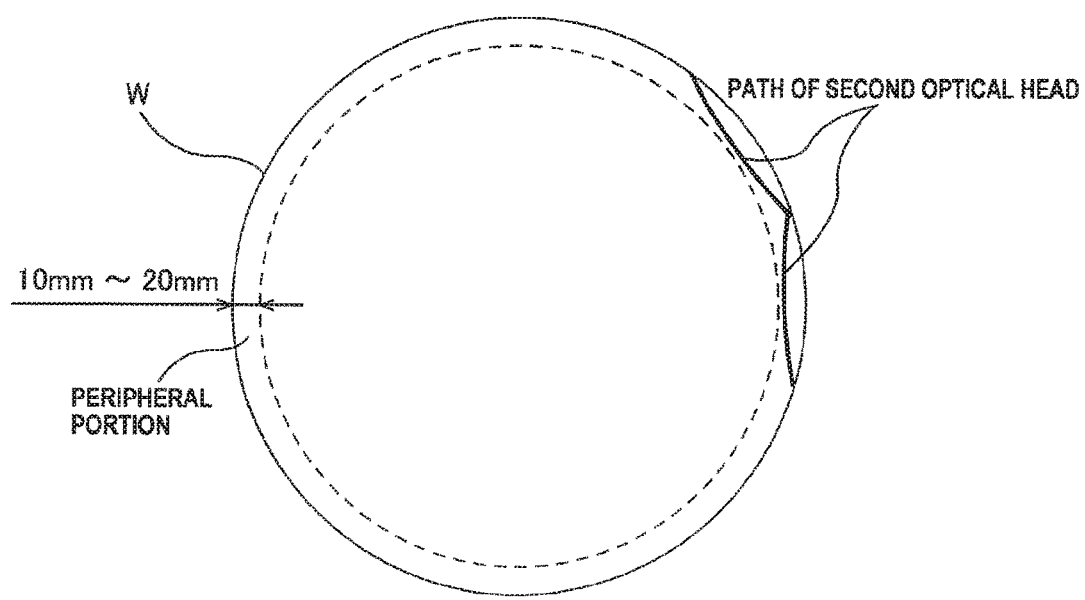
FIG. 8 is a view showing paths of a tip of the second optical head described on a surface of the substrate.

FIG. 8 is a view showing the paths of the tip of the second optical head 13B described on the surface of the substrate W. More specifically, FIG. 8 shows the paths of the second optical head 13B when the polishing table 20 makes two revolutions. As can be seen from FIG. 8, the second optical head 13B moves along the peripheral portion of the substrate W as the polishing table 20 rotates. As a result, the number of measuring points on the peripheral portion becomes larger than the number of measuring points shown in FIG. 2 in the conventional CMP apparatus. Therefore, the film thickness in the peripheral portion of the substrate W can be determined accurately from the larger number of measurement data.

In this specification, the peripheral portion of the substrate is an outermost annular portion of the substrate, as shown in FIG. 8, and a width thereof is in the range of 10 mm to 20 mm. For example, in the case of a substrate having a diameter of 300 mm, the width of the annular peripheral portion is about 10 mm. The peripheral portion is a region where devices are formed. The peripheral portion of the substrate is most likely to be affected by the polishing load and the polishing liquid during polishing, and therefore the film thickness is likely to vary greatly during polishing as compared with other regions. Therefore, highly-accurate monitoring of the film thickness is required during polishing.

The substrate W is polished by the sliding contact between the substrate W and the polishing pad 22 and by chemical action of the polishing liquid. Therefore, portions of the polishing pad 22 where the first optical head 13A and the second optical head 13B are provided do not contribute to polishing of the substrate W. As can be seen from FIG. 8, the second optical head 13B passes through only the peripheral portion of the substrate W and does not pass through other portions. Therefore, the influence of the second optical head 13B on the substrate polishing can be minimized.

In the case where the polishing table 20 has a larger diameter than that of the substrate W, the slower the polishing table 20 rotates, the longer time it takes for the second optical head 13B to pass through the substrate W. Therefore, for example, the polishing table 20 may rotate at a speed of 50 $\text{min}^{-1}$ or less during polishing of the substrate W. Alternatively, the rotational speed of the polishing table 20 may be lowered to less than a preset rotational speed in predetermined time intervals during polishing of the substrate W.

In in-situ measurement in which the film thickness is measured during polishing of the substrate, the polishing liquid may affect the measurement of the film thickness. In particular, in the optical film-thickness measuring device, the light may be blocked by the polishing liquid and as a result highly-accurate measurement may not be performed. Thus, in order to remove the influence of the polishing liquid on the film-thickness measurement, pure water may be supplied onto the polishing pad 22 regularly while the substrate is polished (i.e., water-polished) and the film thickness of the substrate may be measured during supply of the pure water.

Figure 9:
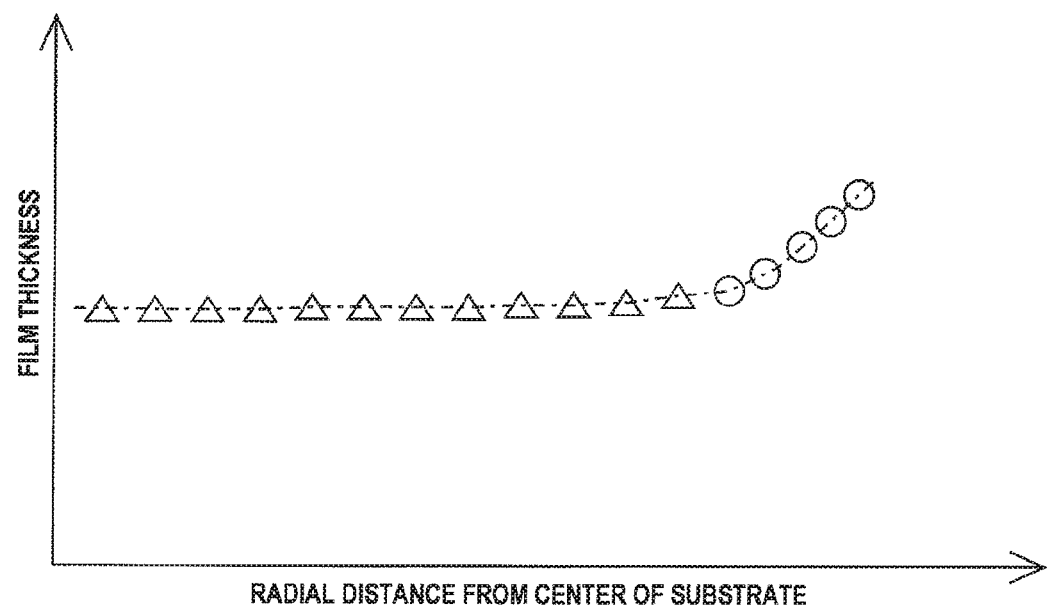
FIG. 9 is an example of a film-thickness profile produced by a processor.

The processer 15 produces the film-thickness profile from a combination of the film-thickness values obtained through the first optical head 13A and the film-thickness values obtained through the second optical head 13B. FIG. 9 is an example of the film-thickness profile produced by the processor 15. As shown in FIG. 9, the film-thickness profile is composed of a large number of film-thickness values that have been determined by the processer 15. The film-thickness values (indicated by Δ) obtained using the first optical head 13A are allotted to portions other than the peripheral portion of the substrate W, and the film-thickness values (indicated by ○) obtained using the second optical head 13B are allotted to the peripheral portion of the substrate W. In this manner, the film-thickness values obtained through the second optical head 13B are used to create a part of the film-thickness profile corresponding to the peripheral portion of the substrate W. Therefore, the processer 15 can produce the highly-accurate film-thickness profile from the center to the peripheral portion of the substrate W.

The film-thickness profile is a film-thickness distribution that indicates a film thickness in each region of the substrate W. By adjusting the polishing load on each region of the substrate during polishing, a desired film-thickness profile or a desired polishing profile (i.e., a profile indicating a distribution of amounts of film removed) can be obtained. The top ring 24 has a mechanism capable of independently pressing plural regions (including the central portion and the peripheral portion) of the substrate W. The top ring 24 having such a mechanism will be described below with reference to FIG. 10.

Figure 10:
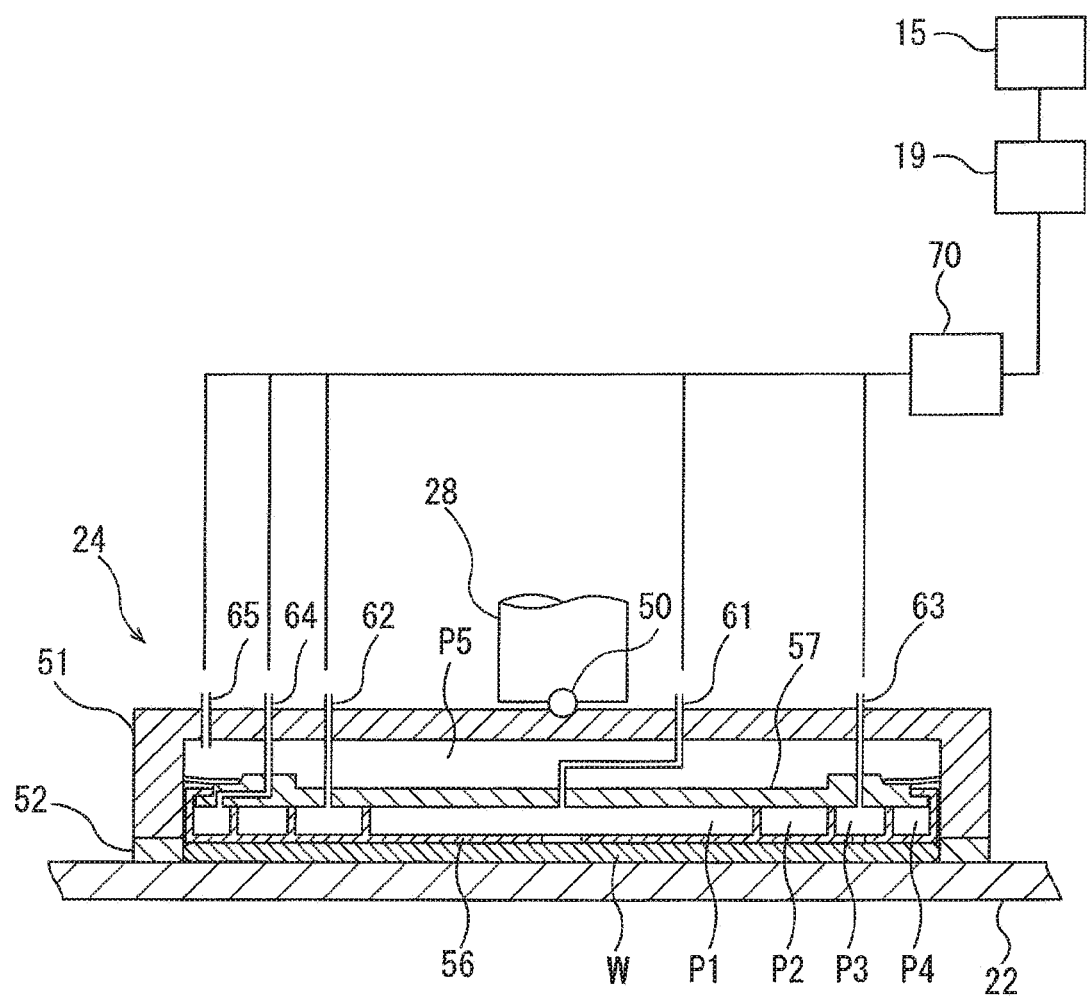
FIG. 10 is a cross-sectional view showing an example of a top ring having a pressing mechanism for pressing plural regions of the substrate independently.

FIG. 10 is a cross-sectional view showing an example of the top ring 24 having the pressing mechanism for pressing plural regions of the substrate independently. The top ring 24 has a top ring body 51 coupled to the top ring shaft 28 via a universal joint 50, and a retainer ring 52 provided on a lower portion of the top ring body 51. The top ring 24 further has a circular flexible membrane 56 to be brought into contact with the substrate W, and a chucking plate 57 that holds the membrane 56. The membrane 56 and the chucking plate 57 are disposed below the top ring body 51. Four pressure chambers (air bags) P1, P2, P3, and P4 are provided between the membrane 56 and the chucking plate 57. The pressure chambers P1, P2, P3, and P4 are formed by the membrane 56 and the chucking plate 57. The central pressure chamber P1 has a circular shape, and the other pressure chambers P2, P3, and P4 have an annular shape. These pressure chambers P1, P2, P3, and P4 are in a concentric arrangement.

Pressurized fluid (e.g., pressurized air) is supplied into the pressure chambers P1, P2, P3, and P4 or vacuum is developed in the pressure chambers P1, P2, P3, and P4 by a pressure-adjusting device 70 through fluid passages 61, 62, 63, and 64, respectively. The pressures in the pressure chambers P1, P2, P3, and P4 can be changed independently to thereby independently adjust loads on four regions of the substrate W: the central portion, an inner intermediate portion, an outer intermediate portion, and the peripheral portion. Further, by elevating or lowering the top ring 24 in its entirety, the retainer ring 52 can press the polishing pad 22 at a predetermined load.

A pressure chamber P5 is formed between the chucking plate 57 and the top ring body 51. Pressurized fluid is supplied into the pressure chamber P5 or vacuum is developed in the pressure chamber P5 by the pressure-adjusting device 70 through a fluid passage 65. With this operation, the chucking plate 57 and the membrane 56 in their entirety can move up and down. The retainer ring 52 is arranged around the substrate W so as to prevent the substrate W from coining off the top ring 24 during polishing. The membrane 56 has an opening in a portion that forms the pressure chamber P3, so that the substrate W can be held by the top ring 24 via the vacuum suction by producing vacuum in the pressure chamber P3. Further, the substrate W can be released from the top ring 24 by supplying nitrogen gas or clean air into the pressure chamber P3.

The pressure-adjusting device 70 is coupled to the controller 19. The polishing loads on the respective portions of the substrate W, i.e., the internal pressures of the pressure chambers P1, P2, P3, and P4, are determined by the controller 19. The controller 19 is coupled to the above-described processor 15, and the film-thickness profile produced by the processor 15 is sent to the controller 19. The controller 19 controls the internal pressures of the pressure chambers P1, P2, P3, and P4 through the pressure-adjusting device 70. Specifically, the controller 19 determines target internal pressures of the pressure chambers P1, P2, P3, and P4 such that the film-thickness profile obtained during polishing coincides with a target film-thickness profile, and sends command signals of the target internal pressures to the pressure-adjusting device 70. The pressure-adjusting device 70 then adjusts the internal pressures of the pressure chambers P1, P2, P3, and P4 based on the command signals sent from the controller 19. With these operations, the top ring 24 can press the respective portions of the substrate W at optimum loads, respectively. It is also possible to control an internal pressure of only one of the pressure chambers (e.g., the internal pressure of the pressure chamber P4 corresponding to the peripheral portion of the substrate W) based on the film-thickness profile obtained. In this embodiment, the second optical head 13B is arranged in a position corresponding to the pressure chamber P4.

Figure 11:
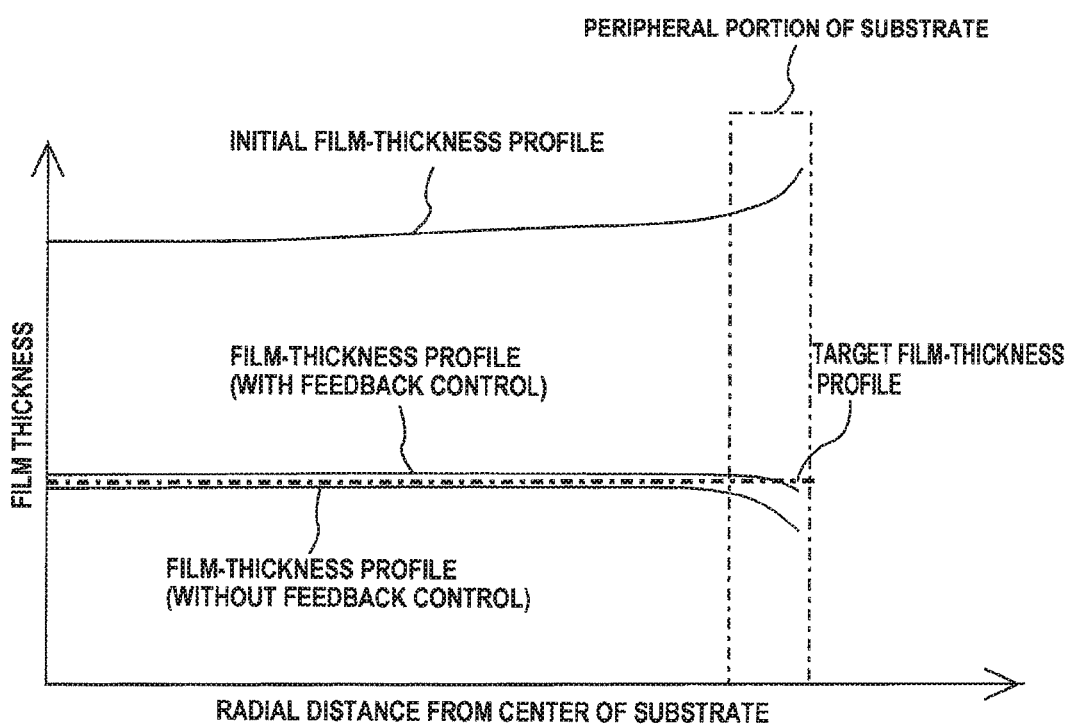
FIG. 11 is a diagram showing film-thickness profiles.

FIG. 11 is a diagram showing a film-thickness profile at a polishing initial stage, a target film-thickness profile, a film-thickness profile when polishing a substrate while performing a feedback control of the polishing loads based on the film-thickness profile obtained during polishing, and a film-thickness profile when polishing a substrate without performing the feedback control. The diagram of FIG. 11 shows polishing results of the substrate having an initial film-thickness profile in which the film in the peripheral portion is thicker than the film in the other portions. As can be seen from FIG. 11, as a result of polishing the substrate while performing the feedback control of the polishing loads based on the film-thickness profile, a film-thickness profile that is similar to the target film-thickness profile is obtained. In contrast, when the feedback control is not performed, a desired film-thickness profile is not obtained.

In general, the same type of substrate is polished under the same polishing conditions. However, since the polishing pad 22 and the retainer ring 52 of the top ring 24, which are consumables of the polishing apparatus, wear away gradually with the polishing time, the film-thickness profile obtained varies gradually even under the same conditions. Such a variation in the film-thickness profile is remarkable particularly in the peripheral portion of the substrate. This is because the polishing load tends to concentrate on the peripheral portion of the substrate and this peripheral portion is likely to be subject to the influence of the wear of the retainer ring 52 and the polishing pad 22. According to the above-described embodiment, because the film thickness in the peripheral portion of the substrate can be measured accurately, polishing error due to the wear of the polishing pad 22 and/or the retainer ring 52 can be detected. Specifically, the wear of the polishing pad 22 and/or the retainer ring 52 can be detected based on a change with time in the film thickness in the peripheral portion of the substrate. For example, if a desired film thickness cannot be achieved even wider the same polishing conditions, then it can be judged that the polishing pad 22 and/or the retainer ring 52 has worn away. In this manner, the film-thickness measurement data at the peripheral portion of the substrate can be used not only for the real-time feedback control of the polishing load on the substrate, but also for the wear detection of the consumables, such as the polishing pad 22 and the retainer ring 52.

Figure 12:
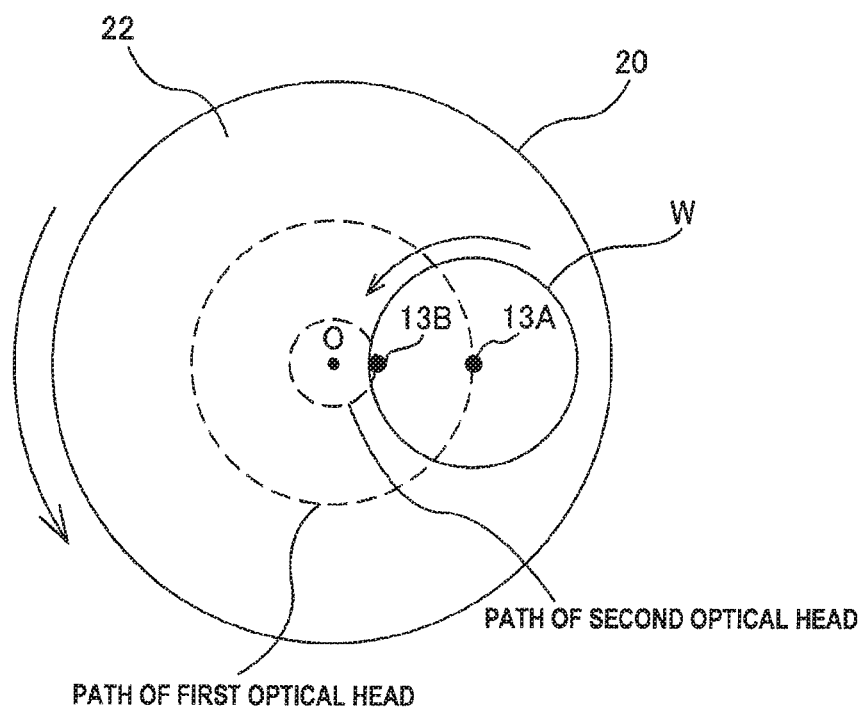
FIG. 12 is a plan view showing another example of arrangement of the first optical head and the second optical head.

FIG. 12 is a plan view showing another example of arrangement of the first optical head 13A and the second optical head 13B. The arrangement of the first optical head 13A and the second optical head 13B shown in FIG. 12 is basically the same as the arrangement shown in FIG. 7, but differs in that the second optical head 13B is closer to the center O of the polishing table 20 than the first optical head 13A is. Specifically, in the example shown in FIG. 12, the second optical head 13B is located inwardly of the first optical head 13A with respect to the radial direction of the polishing table 20. As a result, a distance between the second optical head 13B and the center O of the polishing table 20 is shorter than a distance between the first optical head 13A and the center O of the polishing table 20.

Figure 13:
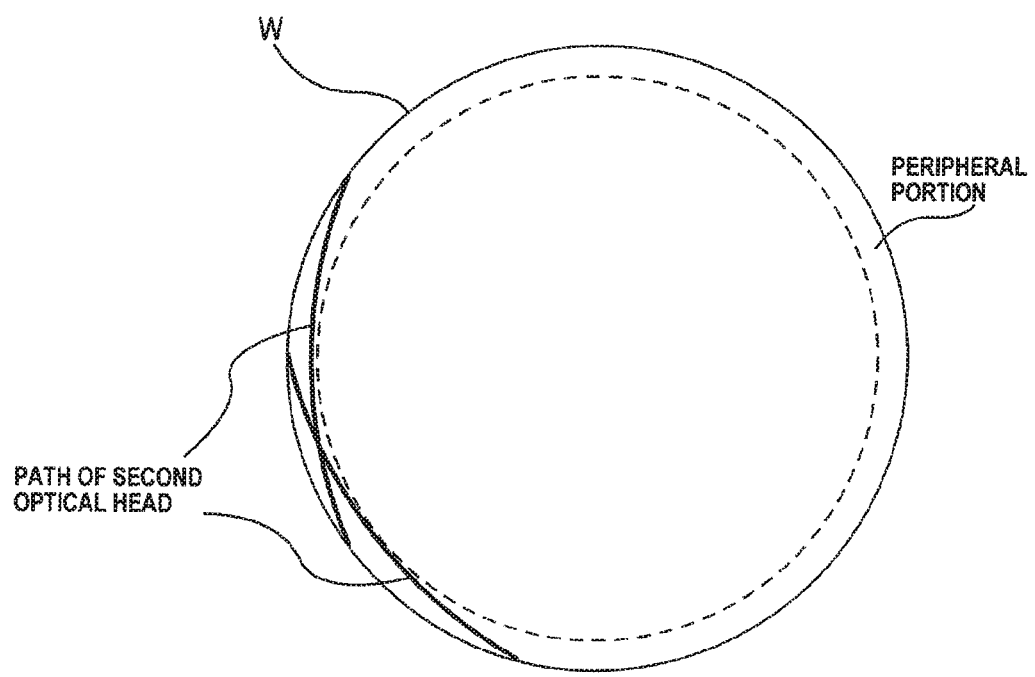
FIG. 13 is a view showing paths of the tip of the second optical head shown in FIG. 12.

FIG. 13 is a view showing paths of the second optical head 13B shown in FIG. 12, and more specifically shows the paths of the second optical head 13B when the polishing table 20 makes two revolutions. As can be seen from FIG. 13, the second optical head 13B moves along the peripheral portion of the substrate W as the polishing table 20 rotates. Therefore, the film thickness in the peripheral portion can be measured at more measuring points. Furthermore, as can be seen from the comparison between the paths shown in FIG. 8 and the paths shown in FIG. 13, the path of the second optical head 13B shown in FIG. 13 is longer than the path of the second optical head 13B shown in FIG. 8. Therefore, with the arrangement shown in FIG. 12, the film thickness in the peripheral portion can be measured at more measuring points. On the other hand, since the second optical head 13B does not contribute to polishing of the substrate W, it is preferable that the path of the second optical head 13B be short, from the standpoint of improvement of a polishing rate (i.e., a removal rate of the film). While the arrangement shown in FIG. 7 provides slightly less measuring points in the peripheral portion of the substrate W as compared with the arrangement shown in FIG. 12, the arrangement shown in FIG. 7 is preferable from the standpoint of improvement of a polishing performance.

Figure 14:
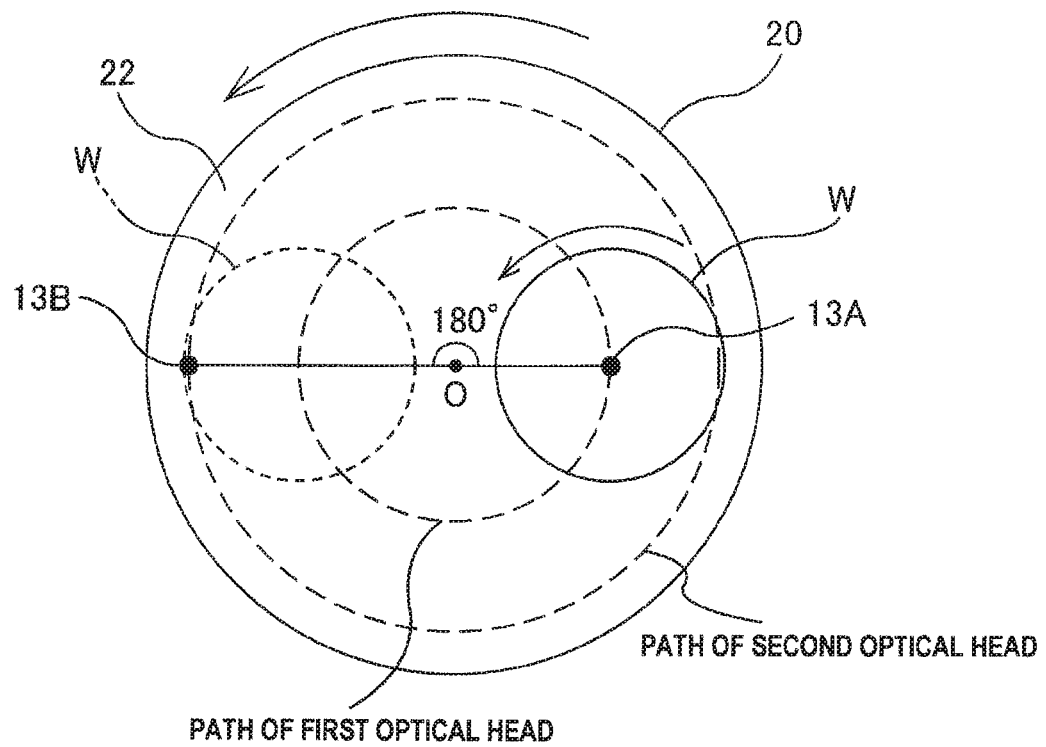
FIG. 14 is a plan view showing still another example of arrangement of the first optical head and the second optical head.

FIG. 14 is a plan view showing still another example of arrangement of the first optical head 13A and the second optical head 13B. As shown in FIG. 14, the first optical head 13A and the second optical head 13B are located at opposite sides with respect to the center O of the polishing table 20. More specifically, a line connecting the first optical head 13A to the center O of the polishing table 20 and a line connecting the second optical head 13B to the center O of the polishing table 20 meet at an angle of substantially 180 degrees. FIG. 14 shows a state in which the first optical head 13A is facing the center of the substrate W (described by a solid line) and a state in which the second optical head 13B is facing the peripheral portion of the substrate W (described by a dotted line). The second optical head 13B is located outwardly of the first optical head 13A with respect to the radial direction of the polishing table 20.

In the above-discussed examples shown in FIG. 7 and FIG. 12, the first optical head 13A and the second optical head 13B apply the light to the substrate W and receive the light from the substrate W substantially simultaneously. In the example shown in FIG. 14, the first optical head 13A and the second optical head 13B apply the light to the substrate W and receive the light from the substrate W at different timings.

As described above, in the arrangement shown in FIG. 14, the film thickness at the central portion of the substrate W and the film thickness at the peripheral portion of the substrate W are measured at different times. Therefore, it is possible to use one spectroscope for receiving both the reflected light from the first optical head 13A and the reflected light from the second optical head 13B. That is, even if one spectroscope receives the reflected light from the central portion of the substrate W and the reflected light from the peripheral portion of the substrate W, these reflected lights are not superimposed in the spectroscope. Further, it is also possible to connect one light source to the first optical head 13A and the second optical head 13B selectively. Next, an example having a common spectroscope and a common light source will be described with reference to FIG. 15.

Figure 15:
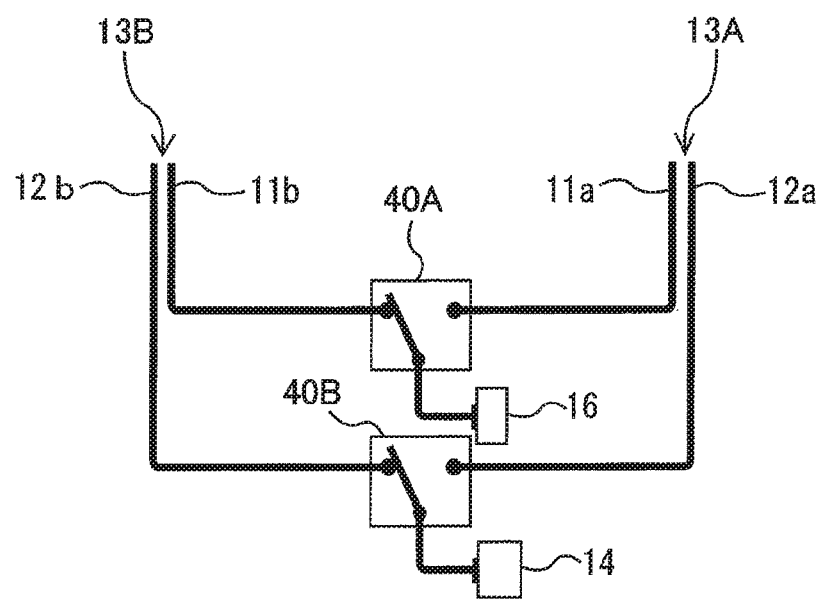
FIG. 15 is a view showing an example in which a common spectroscope and a common light source are provided for the first optical head and the second optical head.

As shown in FIG. 15, the first light-applying unit 11a and the second light-applying unit 11b are coupled to a light source 16 through a first optical switch 40A. This first optical switch 40A is configured to couple the light source 16 to one of the first light-applying unit 11a and the second light-applying unit 11b selectively. Similarly, the first light-receiving unit 12a and the second light-receiving unit 12b are coupled to a spectroscope 14 through a second optical switch 40B. The optical switch is a device for switching light-transmission route. A typical type of optical switch has a mirror for changing a travelling direction of light and switches the light-transmission route by reflecting incident light. Other than the optical switch using the mirror, a waveguide optical switch may be used. This type of optical switch uses a material whose index of refraction varies upon input of heat or electricity. These known optical switches can be used as the first optical switch 40A and the second optical switch 40B.

In the above-described structure, when the first optical head 13A moves across the substrate W, the light source 16 and the spectroscope 14 are coupled to the first light-applying unit 11a and the first light-receiving unit 12a by the optical switches 40A and 40B. When the second optical head 13B moves across the substrate W, the light source 16 and the spectroscope 14 are coupled to the second light-applying unit 11b and the second light-receiving unit 12b by the optical switches 40A and 40B. In this manner, by using the optical switches 40A and 40B, the light source 16 and the spectroscope 14 can be coupled to the first optical head 13A or the second optical head 13B alternately.

In the example shown in FIG. 14, the first optical head 13A and the second optical head 13B are arranged at substantially equal intervals in a circumferential direction of the polishing table 20, so that the first optical head 13A and the second optical head 13B apply the light to the substrate W and receive the reflected light from the substrate W alternately at substantially constant time intervals. Therefore, the processor 15 can secure a sufficient time for processing the measurement data (i.e., data containing measured values of the intensity of the reflected light) sent from the spectroscope 14.

Figure 16:
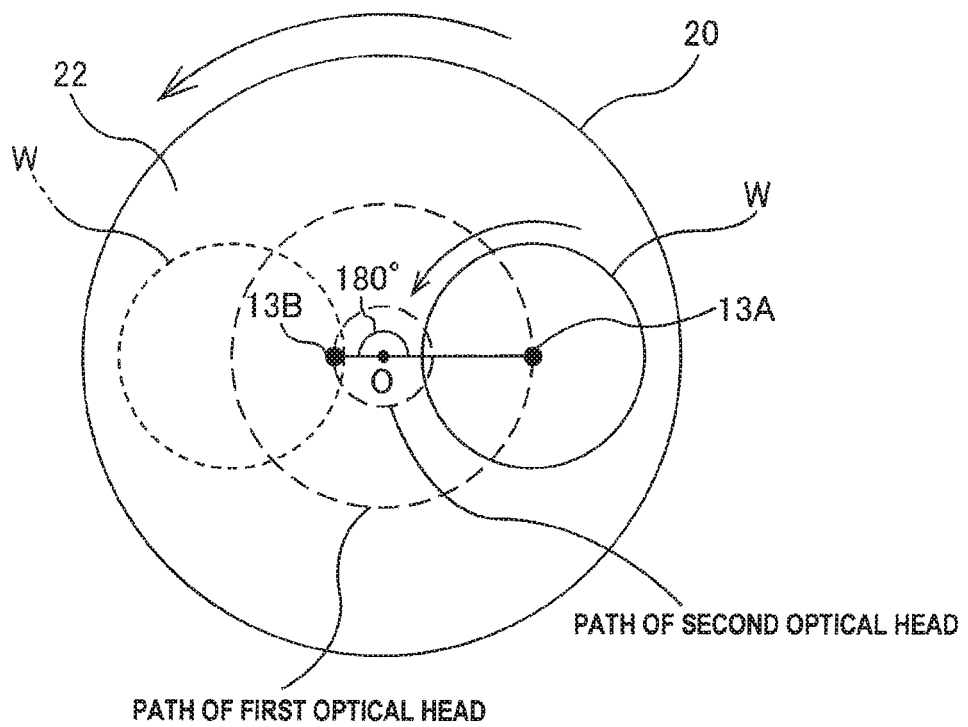
FIG. 16 is a plan view showing still another example of arrangement of the first optical head and the second optical head.

While the second optical head 13B is arranged outwardly of the first optical head 13A with respect to the radial direction of the polishing table 20 in the example of FIG. 14, the second optical head 13B may be arranged inwardly of the first optical head 13A with respect to the radial direction of the polishing table 20 as shown in FIG. 16. Specifically, the line connecting the second optical head 13B to the center O of the polishing table 20 may be shorter than the line connecting the first optical head 13A to the center O of the polishing table 20. In this case also, the same effects as in the examples shown in FIG. 14 and FIG. 15 can be obtained.

Figure 17:
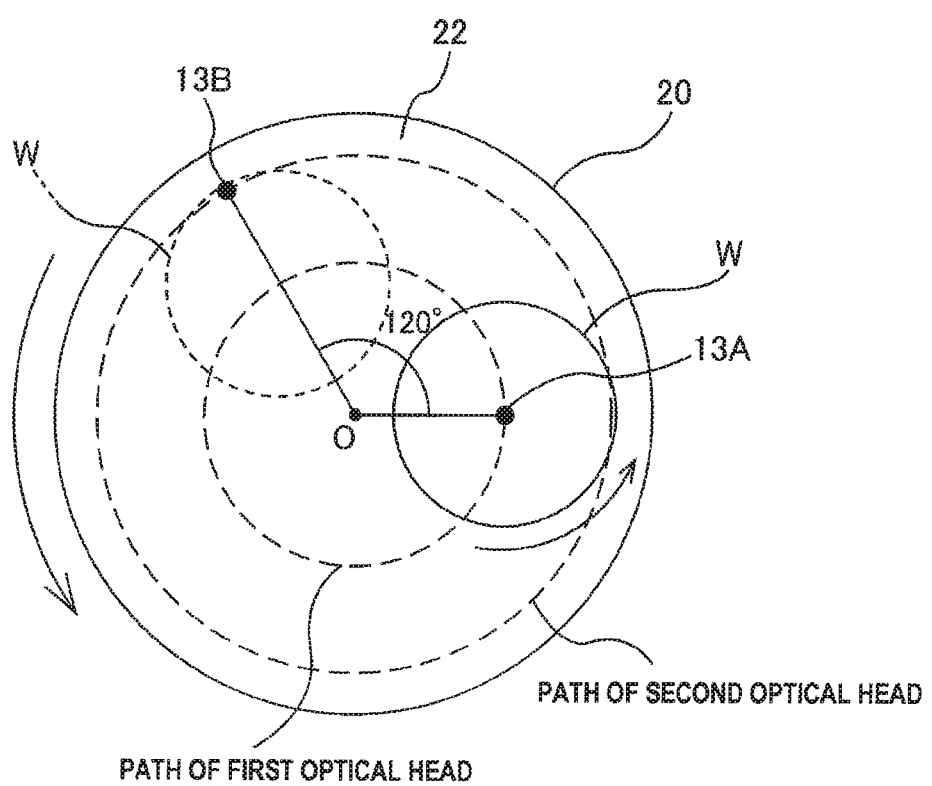
FIG. 17 is a plan view showing still another example of arrangement of the first optical head and the second optical head.

FIG. 17 is a plan view showing still another example of arrangement of the first optical head 13A and the second optical head 13B. In the previously-discussed example shown in FIG. 14, the first optical head 13A and the second optical head 13B are in alignment with each other. In FIG. 17 the second optical head 13B is arranged in a different position than a position of the first optical head 13A with respect to the circumferential direction the polishing table 20. FIG. 17 shows a state in which the first optical head 13A is facing the center of the substrate W (described by a solid line) and a state in which the second optical head 13B is facing the peripheral portion of the substrate W (described by a dotted line). In this example, the line connecting the first optical head 13A to the center O of the polishing table 20 and the line connecting the second optical head 13B to the center O of the polishing table 20 meet at an angle of about 120 degrees. In this example also, the film thickness at the central portion of the substrate W and the film thickness at the peripheral portion of the substrate W are measured at different times. Therefore, the single light source 16 and the single spectroscope 14 can be used for the first optical head 13A and the second optical head 13B selectively as shown in FIG. 15.

Figure 18:
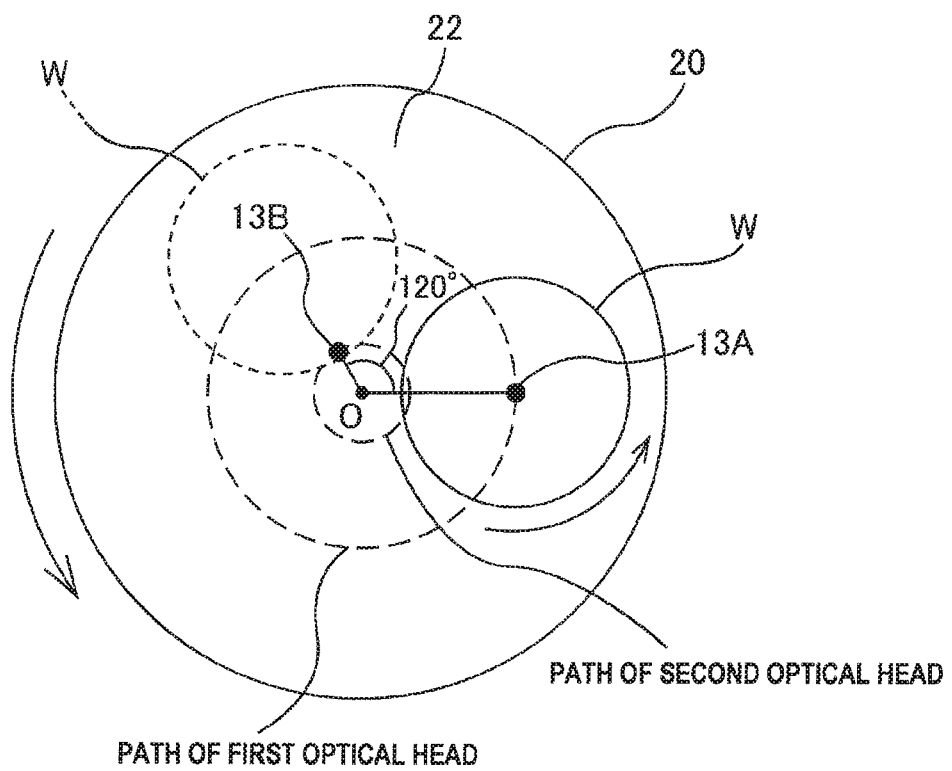
FIG. 18 is a plan view showing still another example of arrangement of the first optical head and the second optical head.

While the second optical head 13B is arranged outwardly of the first optical head 13A with respect to the radial direction of the polishing table 20 in the example of FIG. 17, the second optical head 13B may be arranged inwardly of the first optical head 13A with respect to the radial direction of the polishing table 20 as shown in FIG. 18.

Figure 19:
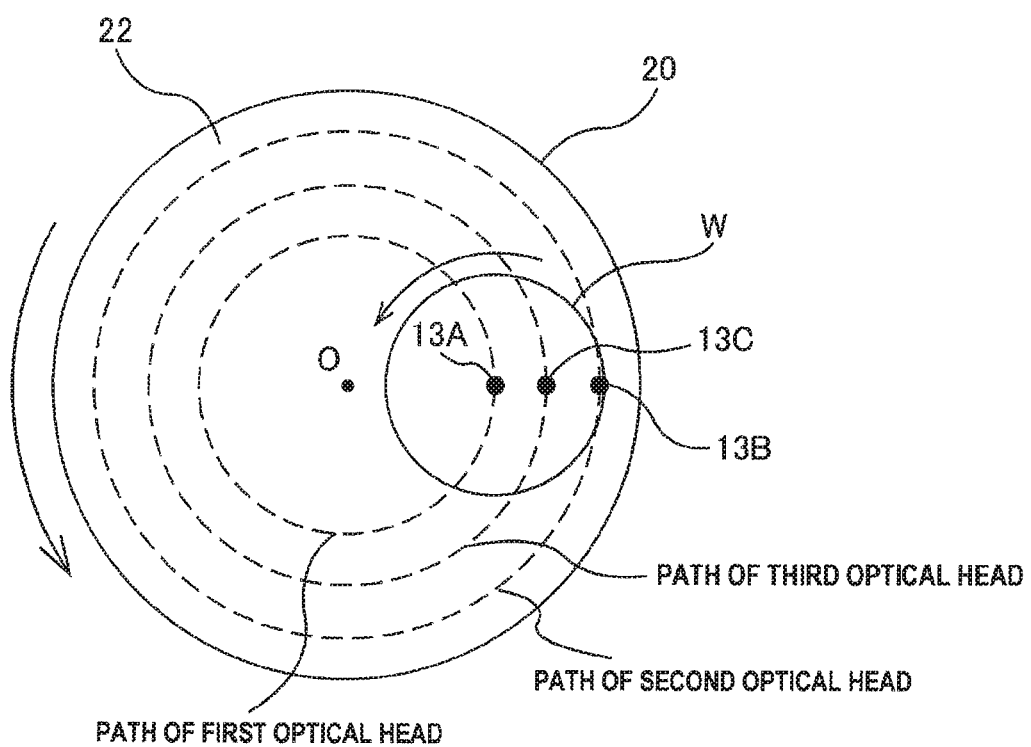
FIG. 19 is a plan view showing an example in which a third optical head is provided in addition to the first optical head and the second optical head.

FIG. 19 is a plan view showing an example in which a third optical head 13C is provided in addition to the first optical head 13A and the second optical head 13B. The third optical head 13C has the same structure as the above-discussed first optical head 13A and the second optical head 13B. The third optical head 13C is coupled to a light source and a spectroscope (not shown). As shown in FIG. 19, the first optical head 13A, the second optical head 13B, and the third optical head 13C are arranged along the radial direction of the polishing table 20. The second optical head 13B and the third optical head 13C are located outwardly of the first optical head 13A.

The arrangement of the first optical head 13A and the second optical head 13B is the same as the arrangement shown in FIG. 7. The third optical head 13C is located in an intermediate point between the first optical head 13A and the second optical head 13B. Specifically, a distance between the first optical head 13A and the third optical head 13C is substantially the same as a distance between the third optical head 13C and the second optical head 13B. The position of the third optical head 13C corresponds to an intermediate portion located between the central portion and the peripheral portion of the substrate. The second optical head 13B is located in a position corresponding to the above-described pressure chamber P4, and the third optical head 13C is located in a position corresponding to the above-described pressure chamber P2 or the pressure chamber P3. Therefore, a more highly-accurate film-thickness profile can be obtained.

Figure 20:
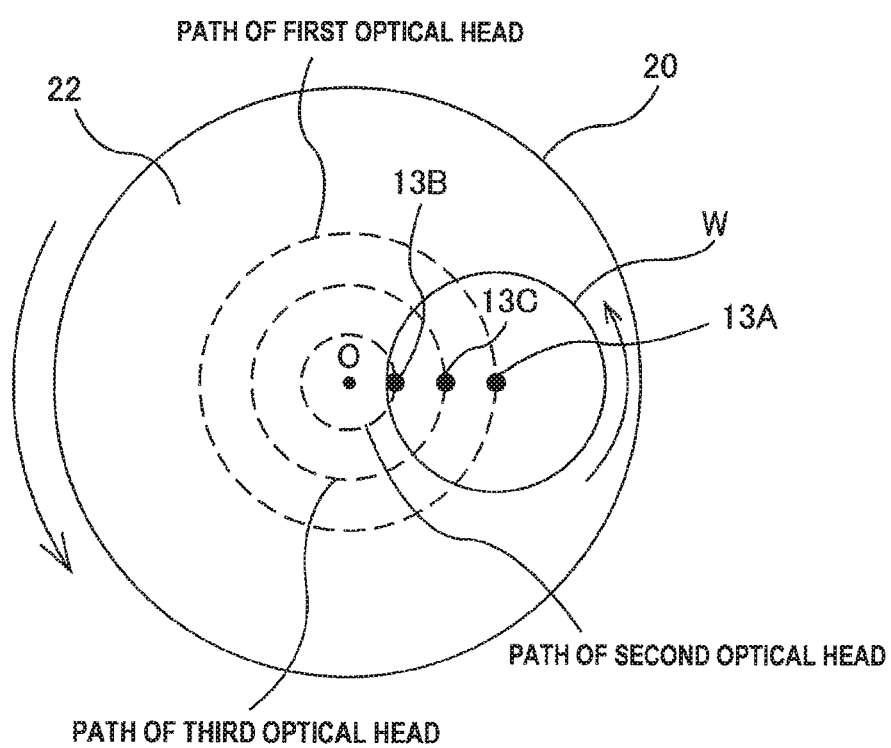
FIG. 20 is a plan view showing another example of arrangement of the first optical head, the second optical head, and the third optical head.

FIG. 20 is a plan view showing another example of arrangement of the first optical head 13A, the second optical head 13B, and the third optical head 13C. The arrangement shown in FIG. 20 is basically the same as the arrangement shown in FIG. 19, but differs in that the second optical head 13B and the third optical head 13C are located inwardly of the first optical head 13A with respect to the radial direction of the polishing table 20. In this example also, the second optical head 13B is located in a position corresponding to the peripheral portion of the substrate, and the third optical head 13C is located in a position corresponding to the intermediate portion located between the central portion and the peripheral portion of the substrate.

Figure 21:
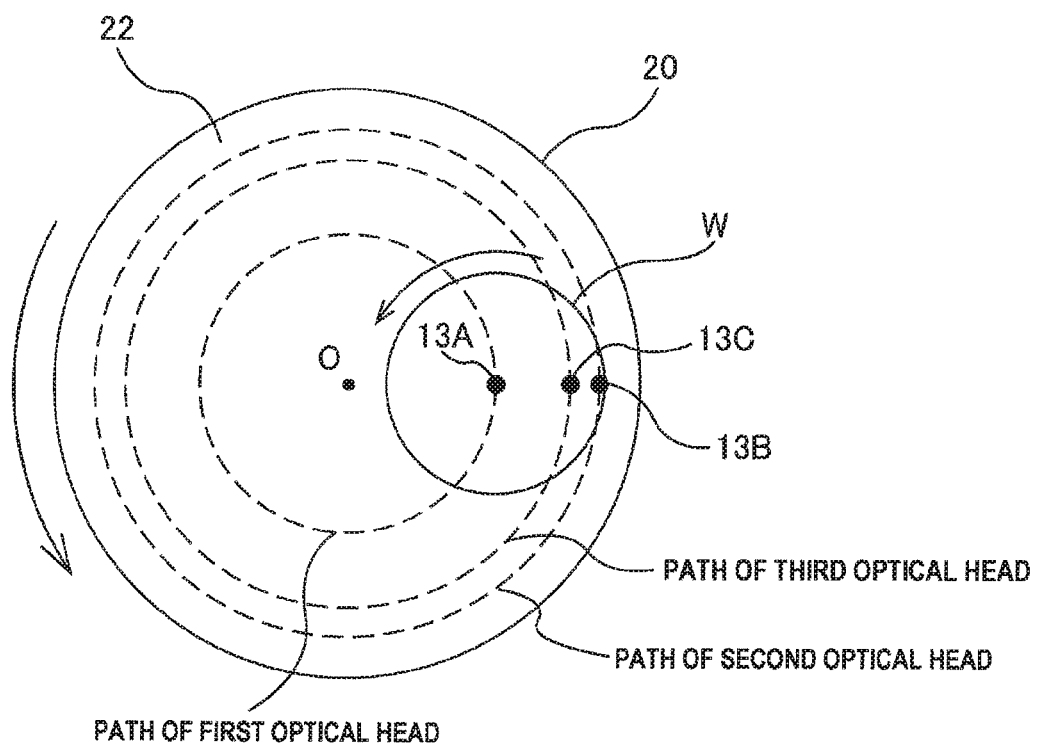
FIG. 21 is a plan view showing still another example of arrangement of the first optical head, the second optical head, and the third optical head.
Figure 22:
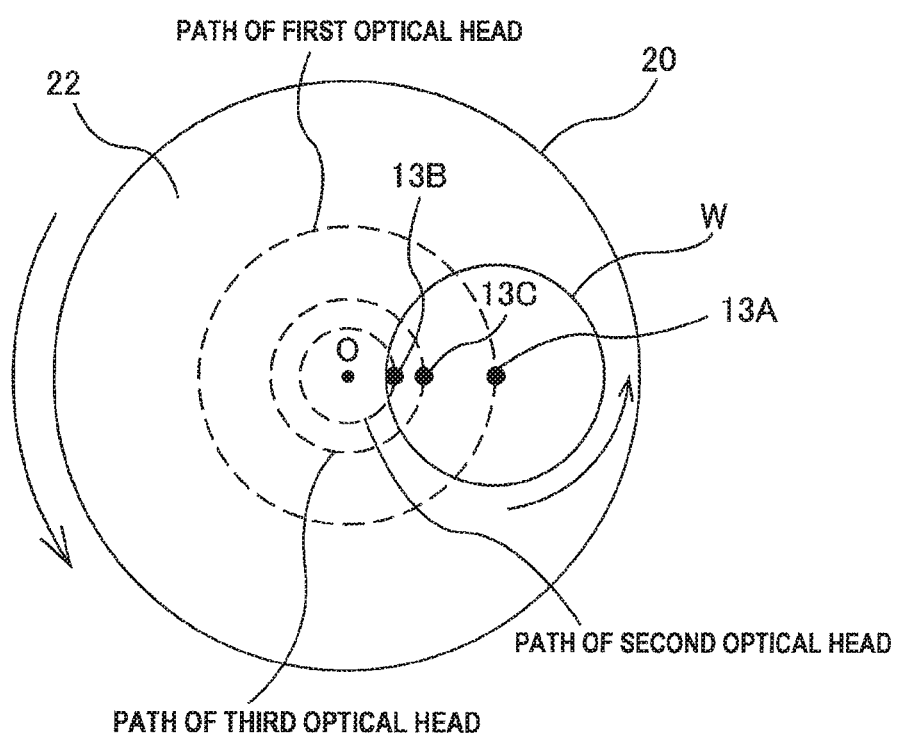
FIG. 22 is a plan view showing still another example of arrangement of the first optical head, the second optical head, and the third optical head.

FIG. 21 is a modified example of the arrangement shown in FIG. 19, and FIG. 22 is a view showing a modified example of the arrangement shown in FIG. 20. As shown in FIG. 21 and FIG. 22, the third optical head 13C may be located closer to the second optical head 13B than to the first optical head 13A. According to these arrangements, the film thickness of the intermediate portion near the peripheral portion of the substrate can be measured using the third optical head 13C.

Figure 23:
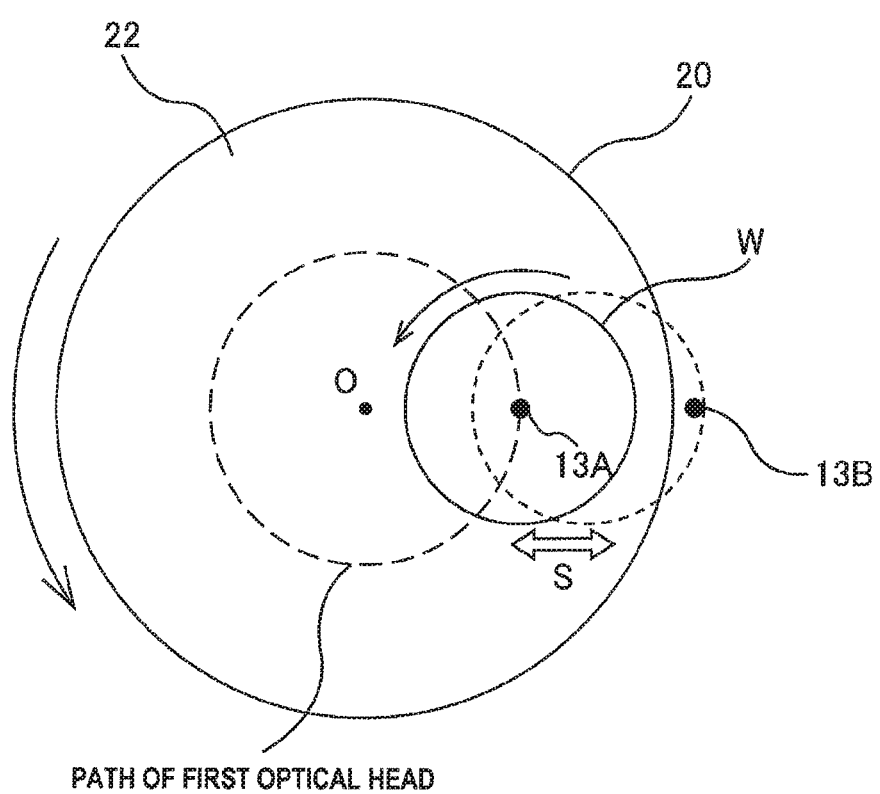
FIG. 23 is a plan view showing another example of arrangement of the second optical head.

FIG. 23 is a plan view showing another example of arrangement of the second optical head 13B. In this example, the second optical head 13B is arranged outwardly of the polishing table 20. The position of the first optical head 13A is the same as in the above-discussed examples. The position of the second optical head 13B is fixed and is supported by a support member (not shown). The second optical head 13B does not rotate together with the polishing table 20. In this example, the top ring 24 (see FIG. 6) oscillates in the radial direction of the polishing table 20 during polishing as indicated by arrow S such that the peripheral portion of the substrate W protrudes from the polishing pad 22 on the polishing table 20. Therefore, the second optical head 13B can apply the light to the exposed peripheral portion of the substrate W and can receive the reflected light from the substrate W.

Figure 24:
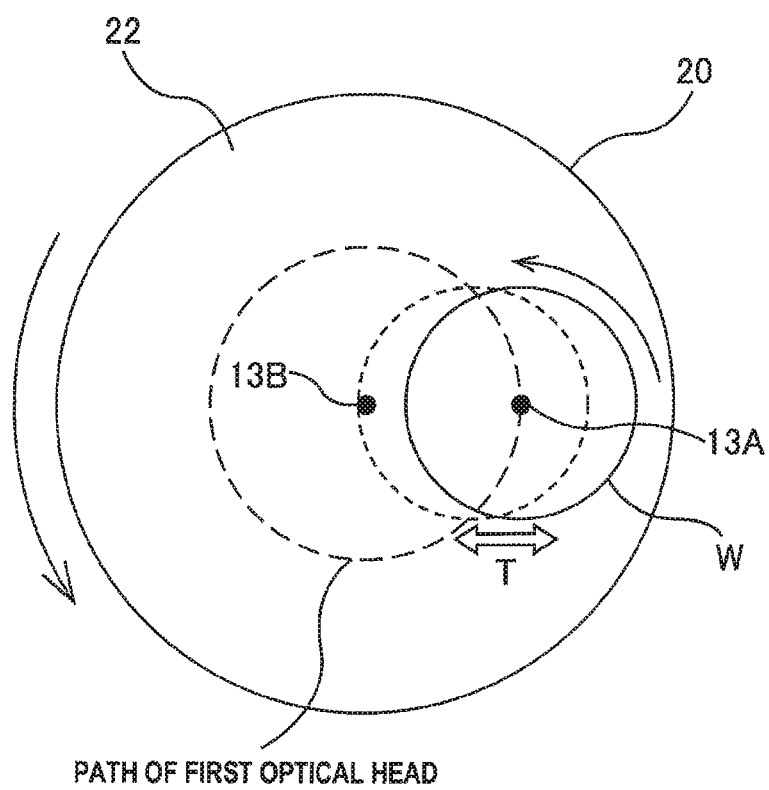
FIG. 24 is a plan view showing still another example of arrangement of the second optical head.

FIG. 24 is a plan view showing still another example of arrangement of the second optical head 13B. In this example, as shown in FIG. 24, the second optical head 13B is located at the center of the polishing table 20. The top ring 24 is configured to oscillate in the radial direction of the polishing table 20 as indicated by arrow T such that the peripheral portion of the substrate W is moved to the center of the polishing table 20. Therefore, in this example also, the second optical head 13B can apply the light to the peripheral portion of the substrate W and can receive the reflected light from the substrate W.

Figure 25:
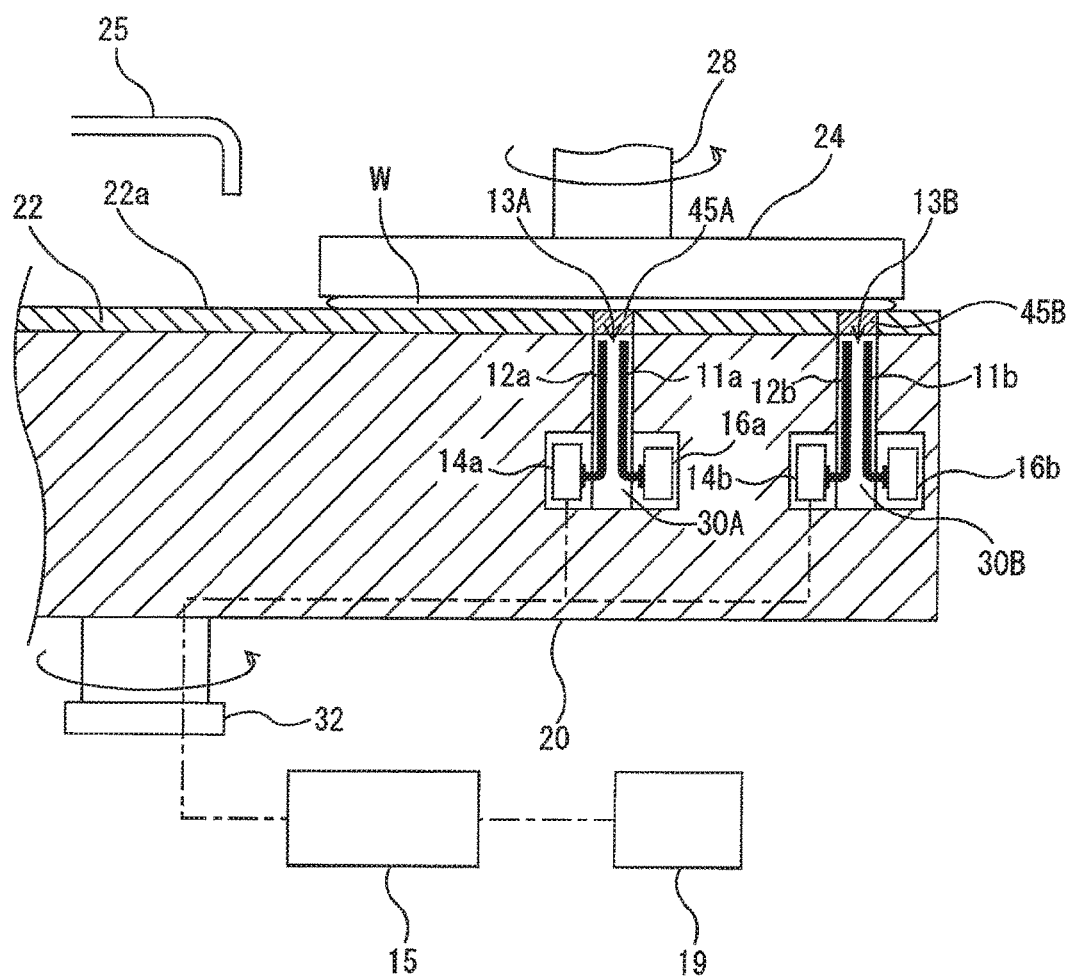
FIG. 25 is a cross-sectional view showing a modified example of the polishing apparatus shown in FIG. 6.

FIG. 25 is a cross-sectional view showing a modified example of the polishing apparatus shown in FIG. 6. In the example shown in FIG. 25, the liquid supply passage, the liquid discharge passage, and the liquid supply source are not provided. Instead, transparent windows 45A and 45B are provided in the polishing pad 22. The light-applying units 11a and 11b direct the light to the surface of the substrate W on the polishing pad 22 through the transparent windows 45A and 45B, and the light-receiving units 12a and 12b receive the reflected light from the substrate W through the transparent windows 45A and 45B. The other structures are the same as those of the polishing apparatus shown in FIG. 6. The transparent windows 45A and 45B can be applied to the examples shown in FIG. 7 through FIG. 24.

Although two or three optical heads are provided in the above examples, the present invention is not limited to them. Four or more optical heads may be provided so long as at least one optical head is arranged so as to face the peripheral portion of the substrate. Moreover, the present invention is not limited to the optical film-thickness measuring device, and can be applied to other type of film-thickness measuring device, such as eddy current sensor. For example, according to the above-discussed examples shown in FIG. 7 through FIG. 24, a first eddy current sensor (film-thickness sensor) may be arranged so as to face the center of the substrate, and a second eddy current sensor may be arranged so as to face the peripheral portion of the substrate.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed:

1. A polishing apparatus for polishing a substrate, comprising:
   a polishing table for holding a polishing pad;
   a top ring configured to press a surface of the substrate against the polishing pad;
   a single common light source configured to emit light;
   a first optical head configured to apply the light to an area including the center of the substrate and to receive reflected light from the substrate while moving across the substrate;
   a second optical head configured to apply the light to a peripheral area of the substrate and to receive reflected light from the substrate while moving along the peripheral area of the substrate;
   a liquid supply passage for supplying transparent liquid in a first hole formed in the polishing table in which the first optical head is located and a second hole formed in the polishing table in which the second optical head is located; and
   a spectroscope that is connected to the first optical head and the second optical head;
   wherein the single common light source is coupled to the first optical head and the second optical head;
   wherein the second optical head is located at a position that is not below the substrate held by the top ring when the first optical head is located at a position that is below the substrate held by the top ring;
   wherein the second optical head is located inwardly of the first optical head with respect to the radial direction of the polishing table;
   wherein the first optical head and the second optical head apply the light alternately to the area including the center of the substrate and to the peripheral area of the substrate while the polishing table makes one rotation.

2. The polishing apparatus according to claim 1, wherein the polishing table is rotatable about its own axis.

3. The polishing apparatus according to claim 1, wherein a line connecting the first optical head to the center of the polishing table and a line connecting the second optical head to the center of the polishing table meet at an angle of substantially 180 degrees.

4. The polishing apparatus according to claim 1, wherein a line connecting the first optical head to the center of the polishing table and a line connecting the second optical head to the center of the polishing table meet at an angle of substantially 120 degrees.

5. The polishing apparatus according to claim 1, wherein the polishing pad has a through-hole that is connected to the hole of the polishing table.

6. The polishing apparatus according to claim 1, further comprising a liquid discharge passage for expelling transparent liquid supplied to the first and second holes of the polishing table.

7. The polishing apparatus according to claim 1, wherein the transparent liquid is water or pure water.

8. The polishing apparatus according to claim 5, further comprising a valve configured to operate in conjunction with the rotation of the polishing table;
   wherein the valve operates so as to stop the flow of the transparent liquid or reduce the flow of the transparent liquid when the substrate is not located over the through-hole.

9. The polishing apparatus according to claim 1, wherein the single common light source is coupled to the first optical head and the second optical head via an optical switch.

10. The polishing apparatus according to claim 1, wherein the peripheral portion of the substrate is an outermost annular portion of the substrate, and the width of the peripheral portion is in the range of 10 mm to 20 mm.

11. The polishing apparatus according to claim 1, wherein the top ring has a mechanism capable of independently pressing the central portion and the peripheral portion of the substrate, and
   wherein the polishing apparatus further comprises a controller that determines polishing loads to the central portion and the peripheral portion of the substrate based on the thickness of the central portion and the peripheral portion of the substrate.

* * * * *